US011856735B2

(12) United States Patent
Schmidt et al.

(10) Patent No.: US 11,856,735 B2
(45) Date of Patent: Dec. 26, 2023

(54) AIR BARRIER SYSTEMS FOR DATA CENTER ZONE CONTAINMENT

(71) Applicant: Rite-Hite Holding Corporation, Milwaukee, WI (US)

(72) Inventors: Blaine Schmidt, Dubuque, IA (US); Kevin J. Gebke, Dubuque, IA (US); Nicholas L. Kaufmann, Sherrill, IA (US); Philip Sloan, Dubuque, IA (US); William A. Niehaus, Holy Cross, IA (US)

(73) Assignee: RITE-HITE HOLDING CORPORATION, Milwaukee, WI (US)

( * ) Notice: Subject to any disclaimer, the term of this patent is extended or adjusted under 35 U.S.C. 154(b) by 1048 days.

(21) Appl. No.: 16/591,475

(22) Filed: Oct. 2, 2019

(65) Prior Publication Data

US 2020/0107474 A1  Apr. 2, 2020

Related U.S. Application Data

(60) Provisional application No. 62/740,390, filed on Oct. 2, 2018.

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01)

(58) Field of Classification Search
CPC ............. H05K 7/20745; H05K 7/1497; H05K 7/20145

(Continued)

(56) References Cited

U.S. PATENT DOCUMENTS 2,013,724 A  9/1935  Brady
3,699,872 A  10/1972  Kruger
(Continued)

FOREIGN PATENT DOCUMENTS

CA  3004141 A1  5/2017
CN  101776943   7/2010
(Continued)

OTHER PUBLICATIONS

Australian Government IP Australia, "Examination report No. 1 for standard patent application," issued in connection with Australian Patent Application No. 2019261805, dated Aug. 26, 2020, (5 pages).

(Continued)

*Primary Examiner* — Steven B Mcallister
*Assistant Examiner* — Charles R Brawner
(74) *Attorney, Agent, or Firm* — Hanley, Flight & Zimmerman, LLC

(57) ABSTRACT

An example air barrier system for a data center within a building is disclosed. The example air barrier system includes a pliable barrier material to partition an area above a top of row of computer cabinets in the data center and below an overhead surface of the building. The pliable barrier material is to reduce mixing of air between first and second aisles on opposites sides of the row of computer cabinets. The example air barrier system also includes a frame to support the pliable barrier material in position when in the area above the top of the row of computer cabinets. The frame is to be supported by the row of computer cabinets without support from the overhead surface.

22 Claims, 18 Drawing Sheets

(58) Field of Classification Search
USPC ......................................................... 454/184
See application file for complete search history.

(56) References Cited

U.S. PATENT DOCUMENTS

| | | | |
|---|---|---|---|
| 3,726,203 | A | 4/1973 | Lindestrom |
| 3,824,909 | A | 7/1974 | Horneff et al. |
| 4,890,544 | A | 1/1990 | Aalto et al. |
| 5,044,259 | A | 9/1991 | Catan et al. |
| 5,094,273 | A | 3/1992 | Eagleton |
| 5,111,739 | A | 5/1992 | Hall |
| 5,137,057 | A | 8/1992 | Hummert, III |
| 5,285,818 | A | 2/1994 | Hummert, III |
| 5,490,813 | A | 2/1996 | Danielsen et al. |
| 5,497,633 | A | 3/1996 | Jones et al. |
| 6,113,486 | A | 9/2000 | Beudon et al. |
| 6,558,250 | B1 | 5/2003 | Paschke |
| 6,565,430 | B2 | 5/2003 | Gebke |
| 6,616,524 | B2 | 9/2003 | Storck, Jr. et al. |
| 6,953,396 | B2 | 10/2005 | Paschke et al. |
| 6,960,130 | B2 | 11/2005 | Gebke et al. |
| 9,103,117 | B1 | 8/2015 | Lundskog et al. |
| 9,152,191 | B1 | 10/2015 | Gardner |
| 9,313,929 | B1 | 4/2016 | Malone et al. |
| 9,485,887 | B1 | 11/2016 | Eichelberg |
| 9,622,389 | B1* | 4/2017 | Roy .......................... F24F 7/00 |
| 9,661,778 | B1 | 5/2017 | Ross et al. |
| 9,888,606 | B1* | 2/2018 | Wendorf ............ H05K 7/20736 |
| 9,894,809 | B1 | 2/2018 | Springs et al. |
| 9,901,011 | B2 | 2/2018 | Heim et al. |
| 10,709,040 | B2 | 7/2020 | Heim et al. |
| 2003/0022617 | A1 | 1/2003 | Gebke et al. |
| 2004/0198215 | A1 | 10/2004 | Bridenne et al. |
| 2004/0229559 | A1 | 11/2004 | Gebke et al. |
| 2005/0225936 | A1 | 10/2005 | Day |
| 2005/0250436 | A1 | 11/2005 | Nilsson |
| 2006/0139877 | A1 | 6/2006 | Germagian et al. |
| 2006/0252365 | A1 | 11/2006 | Gebke |
| 2007/0281639 | A1 | 12/2007 | Clidaras et al. |
| 2008/0158818 | A1 | 7/2008 | Clidaras et al. |
| 2008/0176506 | A1 | 7/2008 | Gebke et al. |
| 2008/0180908 | A1 | 7/2008 | Wexler |
| 2008/0291625 | A1 | 11/2008 | Rathbun, II et al. |
| 2008/0291626 | A1 | 11/2008 | Nelson et al. |
| 2009/0046427 | A1 | 2/2009 | Noteboom et al. |
| 2009/0126293 | A1 | 5/2009 | Khalili et al. |
| 2009/0173017 | A1* | 7/2009 | Hall .................. H05K 7/20745 52/69 |
| 2009/0210096 | A1 | 8/2009 | Stack et al. |
| 2009/0221226 | A1 | 9/2009 | Gebke et al. |
| 2010/0048119 | A1 | 2/2010 | Tashiro |
| 2010/0048121 | A1 | 2/2010 | Klopfenstein et al. |
| 2010/0061057 | A1* | 3/2010 | Dersch ............... H05K 7/20745 29/592.1 |
| 2010/0216388 | A1 | 8/2010 | Tresh et al. |
| 2010/0248609 | A1 | 9/2010 | Tresh et al. |
| 2010/0300650 | A1 | 12/2010 | Bean, Jr. |
| 2011/0108207 | A1* | 5/2011 | Mainers ............. H05K 7/20709 160/311 |
| 2011/0269390 | A1 | 11/2011 | Pinkalla et al. |
| 2011/0319006 | A1 | 12/2011 | Gilder |
| 2012/0006442 | A1 | 1/2012 | Gebke et al. |
| 2012/0073840 | A1 | 3/2012 | Prieur |
| 2012/0125472 | A1 | 5/2012 | Pinkalla et al. |
| 2012/0281352 | A1* | 11/2012 | Namek .............. H05K 7/20745 361/679.46 |
| 2012/0298335 | A1 | 11/2012 | Eckberg et al. |
| 2013/0165035 | A1* | 6/2013 | Krietzman ......... H05K 7/20745 454/184 |
| 2013/0255973 | A1 | 10/2013 | Prieur |
| 2014/0075849 | A1 | 3/2014 | Heim et al. |
| 2014/0202540 | A1 | 7/2014 | Gebke et al. |
| 2014/0254090 | A1 | 9/2014 | Gardner |
| 2015/0056908 | A1 | 2/2015 | Chapel et al. |
| 2015/0296657 | A1* | 10/2015 | Veino ................ H05K 7/20145 165/96 |
| 2016/0029513 | A1 | 1/2016 | Gardner |
| 2017/0127574 | A1* | 5/2017 | Heim ................. H05K 7/20172 |
| 2018/0077822 | A1 | 3/2018 | Sloan et al. |
| 2018/0192551 | A1 | 7/2018 | Heim et al. |

FOREIGN PATENT DOCUMENTS

| | | |
|---|---|---|
| CN | 103238019 | 8/2013 |
| CN | 104578587 | 4/2015 |
| DE | 1956659 | 6/1970 |
| DE | 20010135 | 8/2000 |
| EP | 0856709 | 8/1998 |
| GB | 1589196 | 5/1981 |
| GB | 2120778 | 12/1983 |
| JP | 2004184070 A | 7/2004 |
| JP | 2009036490 A | 2/2009 |
| JP | 2010049330 A | 3/2010 |
| JP | 2011129008 A | 6/2011 |
| JP | 2014052819 A | 3/2014 |
| JP | 2016062379 A | 4/2016 |
| JP | 2017215055 A | 12/2017 |
| WO | 2006119399 | 11/2006 |
| WO | 2010095931 | 8/2010 |
| WO | 2018048804 | 3/2018 |
| WO | 2020/072691 A2 | 4/2020 |

OTHER PUBLICATIONS

European Patent Office, "Extended European Search Report," issued in connection with European Patent Application No. 20173933.1, dated Aug. 3, 2020, (14 pages).

China National Intellectual Property Administration (CNIPA), "Third Office Action," issued in connection with Chinese Patent Application No. 201680071188.6, dated Jun. 3, 2020, (6 pages).

Canadian Intellectual Property Office, "Office Action," issued in connection with Canadian patent application No. 3,086,990, dated Aug. 10, 2021, 5 pages.

Mexican Patent Office, "Notice of Allowance," Issued in connection with Mexican patent application No. MX/a/2019/002740, dated Jul. 5, 2021, 5 pages. (English Machine Translation Attached).

International Searching Authority, "International Preliminary Report on Patentability," issued in connection with PCT application No. PCT/US2019/054354, dated Mar. 23, 2021, 15 pages.

International Searching Authority, "International Search Report and Written Opinion," issued in connection with PCT application No. PCT/US2019/054354, dated Apr. 22, 2020, 20 pages.

United States Patent and Trademark Office, "Non-Final Office Action," issue din connection with U.S. Appl. No. 15/899,278 dated Sep. 15, 2021, 27 pages.

United States Patent and Trademark Office, "Final Office Action," issue din connection with U.S. Appl. No. 15/899,278 dated Sep. 15, 2021, 27 pages.

Mexican Patent Office, "Examination Report," issued in connection with Mexican Patent Application No. MX/a/2018/005564, dated Aug. 24, 2021, 9 pages. (Machine Translation Included).

Canadian Intellectual Property Office, "Examination Report," issued in connection with Canadian patent application No. 3,087,011, dated Sep. 20, 2021, 3 pages.

China National Intellectual Property Administration (CNIPA), "Notice of Granting Patent Right for Invention," issued in connection with Chinese Patent Application No. 201680071188.6, dated Sep. 14, 2020, (4 pages).

Mexican Patent Office, "Office Action," Issued in connection with Mexican patent application No. MX/a/2018/005564, dated Apr. 14, 2021, 5 pages. (Machine Translation Included).

International, Searching Authority, "Invitation to Pay Additional Fees and Where Applicable Protest Fee" issued in connection with PCT application No. PCT/US2019/054354 dated Jan. 14, 2020, (14 pages).

International Searching Authority, "International Search Report and Written Opinion," issued in connection with PCT application No. PCT/US2016/059843, dated Feb. 6, 2017, (15 pages).

(56) References Cited

OTHER PUBLICATIONS

United States Patent and Trademark Office, "Notice of Allowance and Fee(s) Due," issued in connection with U.S. Appl. No. 14/932,676, dated Sep. 18, 2017, (8 pages).
United States Patent and Trademark Office, "Non Final Office Action," issued in connection with U.S. Appl. No. 14/932,676, dated May 8, 2017, (27 pages).
International Searching Authority, "International Search Report and Written Opinion," issued in connection with PCT application No. PCT/US2017/050092, dated Nov. 21, 2017, (17 pages).
United States Patent and Trademark Office, "Non Final Office Action," issued in connection with U.S. Appl. No. 15/261,280, dated Apr. 23, 2018, (22 pages).
Australian Government, "Examination Report No. 1 for Standard Patent Application," issued in connection with Australian Patent Application No. 2016350706, dated Nov. 1, 2018, (4 pages).
United States Patent and Trademark Office, "Notice of Allowance and Fee(s) Due," issued in connection with U.S. Appl. No. 15/261,280, dated Nov. 19, 2018, (27 pages).
United States Patent and Trademark Office, "Non Final Office Action," issued in connection with U.S. Appl. No. 15/899,278, dated Nov. 20, 2018, (45 pages).
Canadian Intellectual Property Office, "Examination Report" issued in connection with Canadian application No. 3,004,141, dated Jan. 21, 2019, (4 pages).
United States Patent and Trademark Office, "Final Office Action," issued in connection with U.S. Appl. No. 15/899,278, dated Jun. 21, 2019, (36 pages).
State Intellectual Property Office (SIPO) of the People's Republic of China, "Notification of the First Office Action," issued in connection with Chinese Patent Application No. 201680071188.6, dated Jun. 12, 2019, (35 pages).
Australian Government, "Notice of Acceptance for Patent Application," issued in connection with Australian Patent Application No. 2016350706, dated Jul. 26, 2019, (3 pages).
Australian Government, "Examination Report No. 1 for Standard Patent Application," issued in connection with Australian Patent Application No. 2017324277, dated Nov. 7, 2019 (4 pages).
State Intellectual Property Office (SIPO) of the People's Republic of China, "Notification of the First Office Action," issued in connection with Chinese Patent Application No. 201780055429.2, dated Nov. 12, 2019, (9 pages).
State Intellectual Property Office (SIPO) of the People's Republic of China, "Notification of the Second Office Action," issued in connection with Chinese Patent Application No. 201680071188.6, dated Feb. 28, 2020, (24 pages).
Intellectual Property India, "Examination Report", issued in connection with Indian Application No. 20197008713, dated Mar. 9, 2020, (8 pages).
European Patent Office, "Examination Report" issued in connection with European Patent Application No. 16795505.3, dated Apr. 22, 2020, (7 pages).
United States Patent and Trademark Office, "Non Final Office Action," issued in connection with U.S. Appl. No. 15/899,278, dated Apr. 13, 2020, (48 pages).
Canadian Intellecutal Preoperty Office, "Notice of Allowability" issued in connection with Canadian application No. 3,004,141, dated Mar. 12, 2020, (1 pages).
United States Patent and Trademark Office, "Non Final Office Action," issued in connection with U.S. Appl. No. 15/899,280, dated Jul. 18, 2019, (23 pages).
United States Patent and Trademark Office, "Non Final Office Action," issued in connection with U.S. Appl. No. 15/899,280, dated Nov. 20, 2018, (57 pages).
United States Patent and Trademark Office, "Notice of Allowance and Fee(s) Due," issued in connection with U.S. Appl. No. 15/899,280, dated Mar. 5, 2020, (57 pages).
United States Patent and Trademark Office, "Advisory Action," issued in connection with U.S. Appl. No. 15/899,278, dated Sep. 12, 2019, (3 pages).

Canadian Intellecutal Preoperty Office, "Examination Report" issued in connection with Canadian application No. 3,035,838 dated May 7, 2020, (6 pages).
Intellectual Property India, "Examination Report", issued in connection with Indian Application No. 201817018308, dated May 20, 2020, (6 pages).
State Intellectual Property Office (SIPO) of the People's Republic of China, "Notice of Granting Patent Right for Invention," issued in connection with Chinese Patent Application No. 201780055429.2, dated May 29, 2020, (4 pages).
Mexican Patent Office, "Office Action," issued in connection with Mexican patent application No. MX/a/2018/005564, dated Jul. 19, 2018, 2 pages. (English Translation Not Available).
Mexican Patent Office, "Office Action," issued in connection with Mexican patent application No. MX/a/2019/002740 dated Apr. 5, 2021, 3 pages. (English Translation Not Available).
United States Patent and Trademark Office, "Non-Final Office Action," issued in connection with U.S. Appl. No. 15/899,278, dated Mar. 25, 2021, 19 pages.
IP Australia, "Notice of Acceptance for Patent Application," issued in connection with Australian application No. 2019261805, dated Mar. 5, 2021, 3 pages.
United States Patent and Trademark Office, "Final Office Action," issued in connection with U.S. Appl. No. 15/899,278, dated Nov. 9, 2020, 18 pages.
Japanese Patent Office, "Notice Of Allowance," issued in connection with Japanese patent application No. P2021-518134, dated Jan. 4, 2023, 6 pages. (with English Machine Translation).
European Patent Office, "Communication under Rule 71(3) EPC," issued in connection with European patent application No. 20173933.1, dated Dec. 19, 2022, 42 pages.
Canadian Patent Office, "Examination Report," issued in connetion with Canadian Patent Application No. 3,115,219, dated Mar. 7, 2023, 6 pages.
European Patent Office, "Communication Pursuant to Article 94(3) EPC," issued in connection with European Patent Application No. 16795505.3, dated Jun. 21, 2022, 5 pages.
European Patent Office, "Communication Pursuant to Article 71(3) EPC," issued in connection with European Patent Application No. 16795505.3, dated Jan. 4, 2022, 7 pages.
Mexican Patent Office, "Notice of Allowance," issued in connection with Mexican Patent Application No. MX/a/2018/005564, dated Oct. 29, 2021, 5 pages. (English Machine Translation Included).
Canadian Patent Office, "Office Action," issued in connection with Canadian patent Application No. 3,086,990, dated Jan. 24, 2022, 4 pages.
Canadian Patent Office, "Notice of Allowance," issued in connection with Canadian patent application No. 3,086,990, dated Jul. 26, 2022, 1 page.
Australian Patent Office, "Examination Report No. 1 for Your Standard Patent Application," issued in connection with Australian patent application No. 2019355930, dated Dec. 8, 2021, 4 pages.
Australian Patent Office, "Notice of Acceptance for Patent Application," issued in connection with Australian patent application No. 2019355930, dated May 31, 2022, 3 pages.
Canadian Patent Office, "Examination Report," issued in connetion with Canadian patent application No. 3,115,219, dated May 13, 2022, 3 pages.
Indian Patent Office, "Office Action," issued in connection with Indian patent application No. 202117019162, dated Feb. 21, 2022, 8 pages.
Japanese Patent Office, "Notice of Reasons for Rejection," issued in connection with Japanese patent application No. P2021-518134, dated Jun. 14, 2022, 10 pages. (English Machine Translation).
IP Australia, "Examination report No. 1 for standard patent application," issued in connection with Australian Patent Application No. 2022228192, dated May 2, 2023, 5 pages.
European Patent Office, "Extended European Search Report," issued in connection with European Patent Application No. 23170720.9, dated Jul. 27, 2023, 15 pages.
European Patent Office, "Communication Pursuant to Article 94(3)," issued in connection with European Patent Application No. 19794290.7, dated Sep. 7, 2023, 4 pages.

(56) References Cited

OTHER PUBLICATIONS

China National Intellectual Property Administration, "Non-Final Office Action," issued in connection with Chinese Patent Application No. 201980079492.9, dated Aug. 25, 2023, 6 pages [English Machine Translation Included].

* cited by examiner

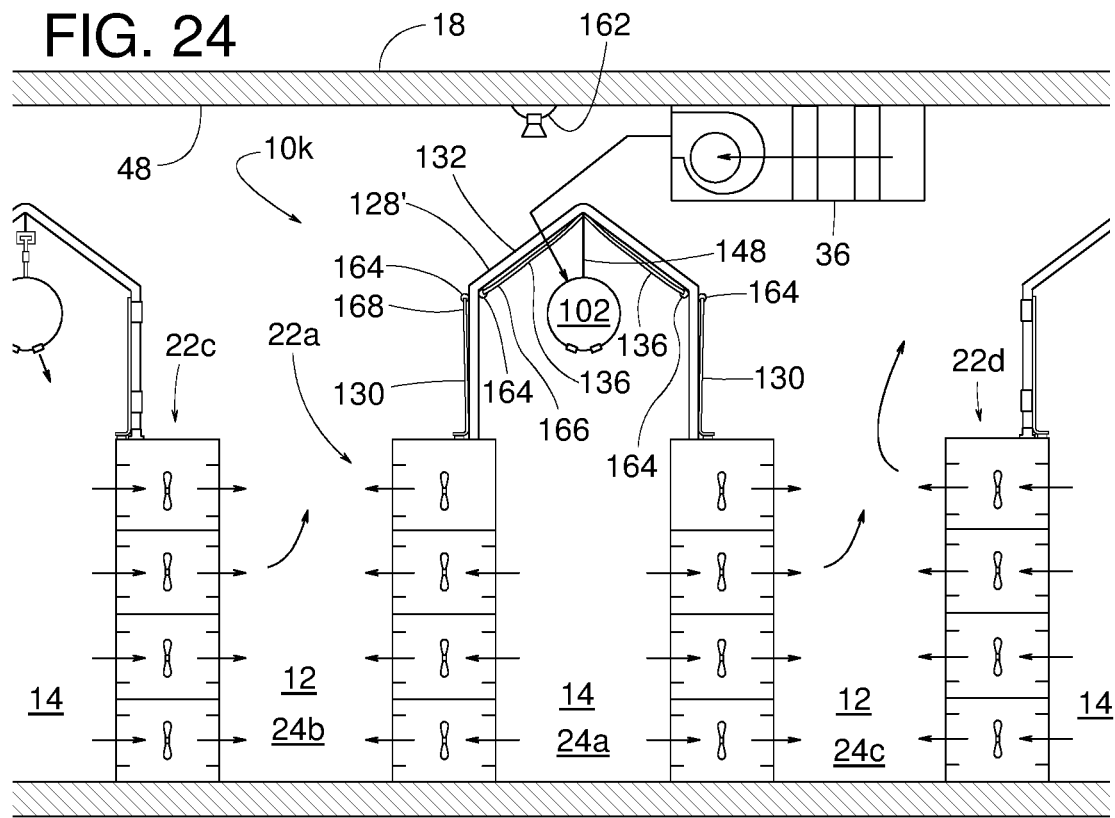
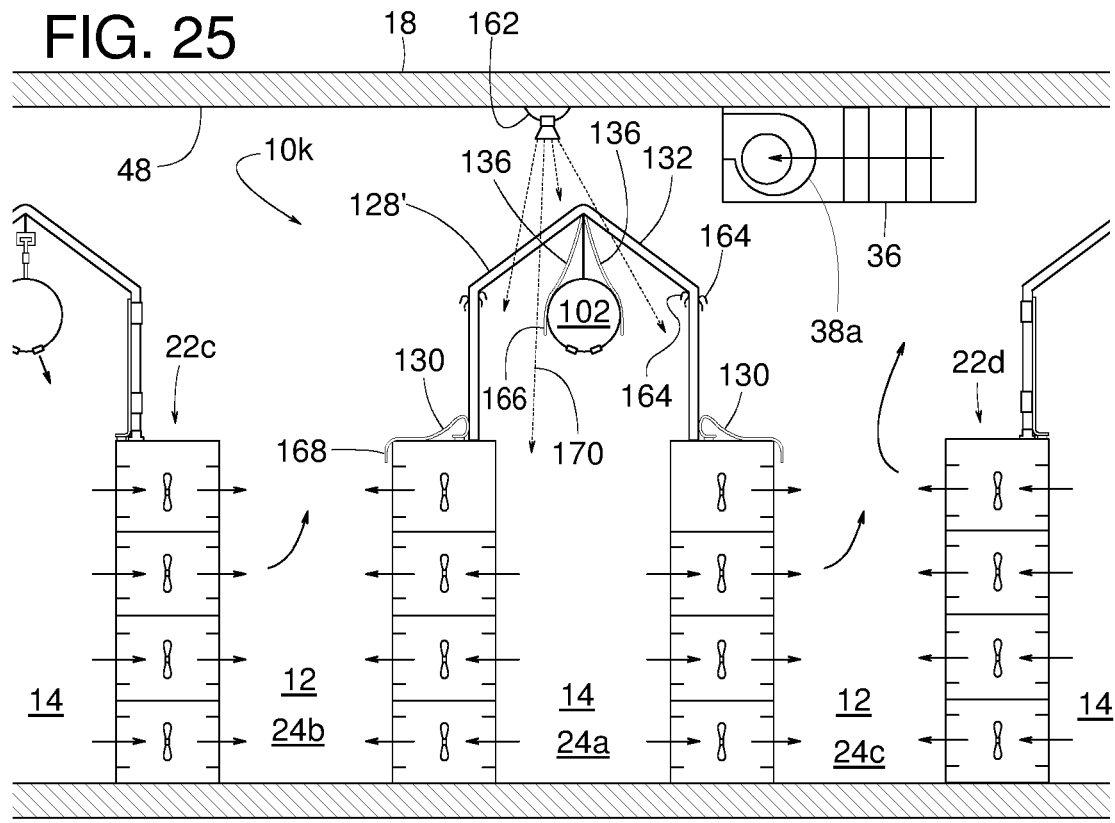

AIR BARRIER SYSTEMS FOR DATA CENTER ZONE CONTAINMENT

RELATED APPLICATIONS

This patent claims the benefit of U.S. Provisional Patent Application No. 62/740,390, which was filed on Oct. 2, 2018. U.S. Provisional Patent Application No. 62/740,390 is incorporated herein by reference in its entirety.

FIELD OF THE DISCLOSURE

This patent generally pertains to air barrier systems and, more specifically, to air barrier systems for data centers having rows of computer cabinets.

BACKGROUND

Server-based data centers, sometimes known as server farms or server clusters, are a large collection of computers, often at a physically remote but network accessible location, that provide clients with expanded computing capability. The expanded computing capability typically is in the form of data storage, data processing, database management, file management, and website management.

Each computer of the system usually comprises a base or case supporting a set of computer components. Depending on the application, computer components may include items such as one or more microprocessors, hard drives, solid state memory devices, routers, power supplies, fans, and heat sinks/exchangers. To maintain the components at a safe operating temperature, a current of environmentally controlled air flows from a first or front side of the computer, across the computer components, and out through a second or back side of the computer. In some cases, the current of air is created by one or more fans associated with or incorporated into each computer. Additionally or alternatively, air flow across computer components can be generated by a fan associated with a set of computers and/or a pressure differential created in the space by an air conditioning system associated with the room or a section of the room.

The computers are stacked in rack-like cabinets that are generally arranged in rows separated by aisles. The aisles provide physical access to the first and second sides of the computers. The rows of computers may be oriented such that each individual aisle is exposed solely to first or second sides of the row of computers. Thus, the first sides of computers in one row face the first sides of computers in the adjacent row across the aisle. In the adjacent aisle, the second sides of computers on opposite sides of that aisle face each other. Aisles exposed to the first sides of computers are generally cooler than aisles exposed to the second sides of computers due to the transfer of heat from computer components to the air current passing across them from the first sides of the computers to the second sides. Thus, the aisles exposed to the first sides of computers are often called "cold aisles," and the aisles exposed to the second side of computers are known as "hot aisles." Each aisle being exposed to only first sides of computers or only to second sides of computers creates an alternating arrangement of cold aisles and hot aisles.

Data centers usually run continuously and generate a significant amount of heat. Consequently, a building's HVAC system (heating, ventilating and air conditioning system) provides air conditioning to prevent heat from building up within the space and causing damage to the computers.

BRIEF DESCRIPTION OF THE DRAWINGS

FIG. 24 is a cross-sectional view similar to FIG. 15 but showing another example air barrier system constructed in accordance with teachings disclosed herein, wherein reconfigurable portions of the system are in their normal configuration.

FIG. 25 is a cross-sectional view similar to FIG. 25 but showing the reconfigurable portions of the system in their collapsed configuration.

DETAILED DESCRIPTION

Figure 1:
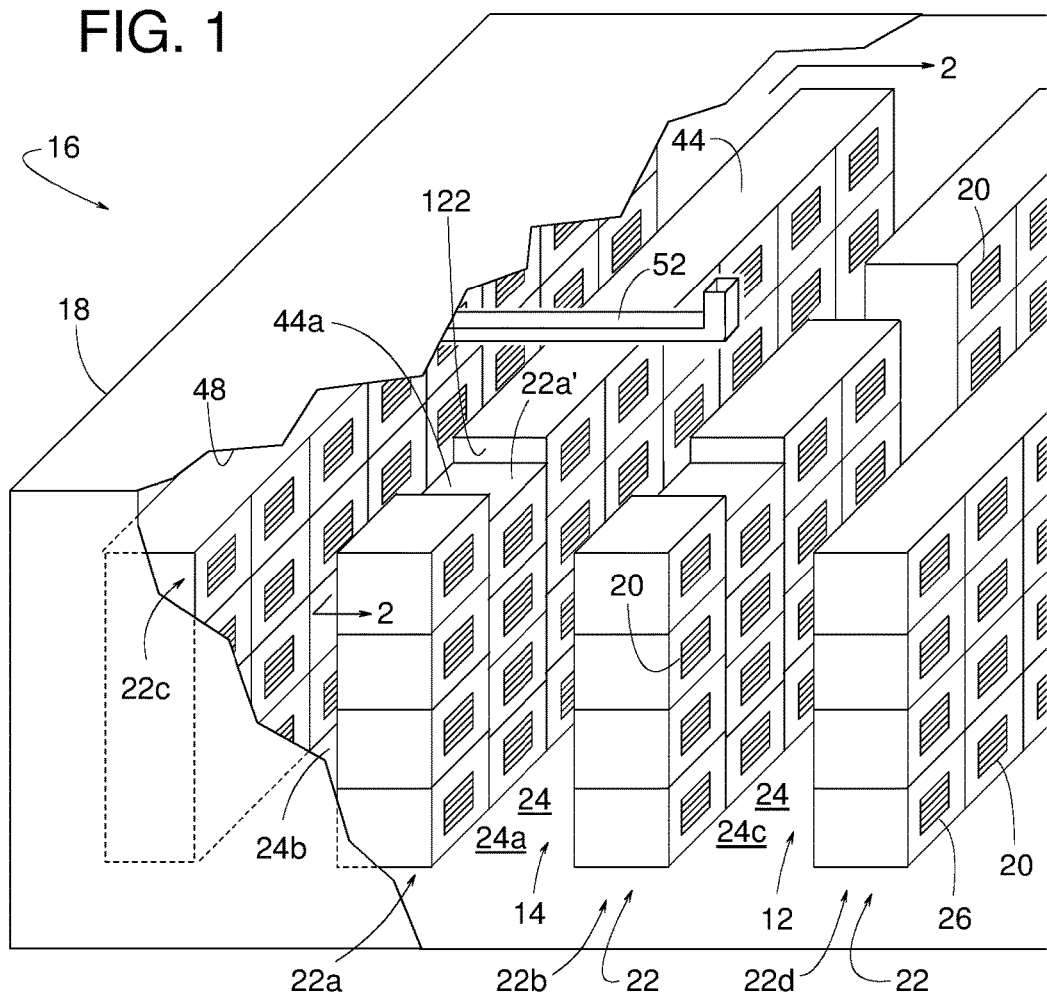
FIG. 1 is a cutaway perspective view of an example data center or server farm.

Example air barrier systems for cooling rows of computer cabinets in a data center include inflatable or otherwise lightweight barriers. Some example systems disclosed herein include multiple horizontally elongate airducts stacked upon the top of the cabinets. In some examples, the stacked airducts fit around various obstructions above the cabinets. In some examples, the airducts seal a void between adjacent cabinets of different heights. In some examples, one or more vertically elongate inflatable airducts provide sealing between cabinets or between a cabinet and an adjacent wall of a building that contains the cabinets. In some examples, one or more vertically elongate airducts can be manually deflected to create a walk-through opening. Some example barrier systems include a shelter that rests upon two rows of computer cabinets and spans an aisle between those two rows.

FIGS. 1-30 show various example air barrier systems 10 (air barrier systems 10a-r) that are particularly suited for separating hot zones (e.g., aisles 12) and cold zones (e.g., aisles 14) of a data center 16. The data center 16, in the example shown in FIG. 1, comprises a building 18 containing a plurality of computers 20 arranged in several rows of cabinets 22. The term, "computer" refers to any digital processing device, examples of which include a server, a data storage device, a hard drive, a solid state memory, etc. The term, "cabinet" refers to any structure for supporting and/or housing the computers 20. Examples of the cabinet 22 include a plurality of enclosures for supporting and/or housing at least one computer, a single enclosure for containing a single computer, a single enclosure for housing a plurality of computers, a rack, a shelf, etc. The term, "computer cabinet" refers to the combination of a cabinet with at least one computer.

Figure 3:
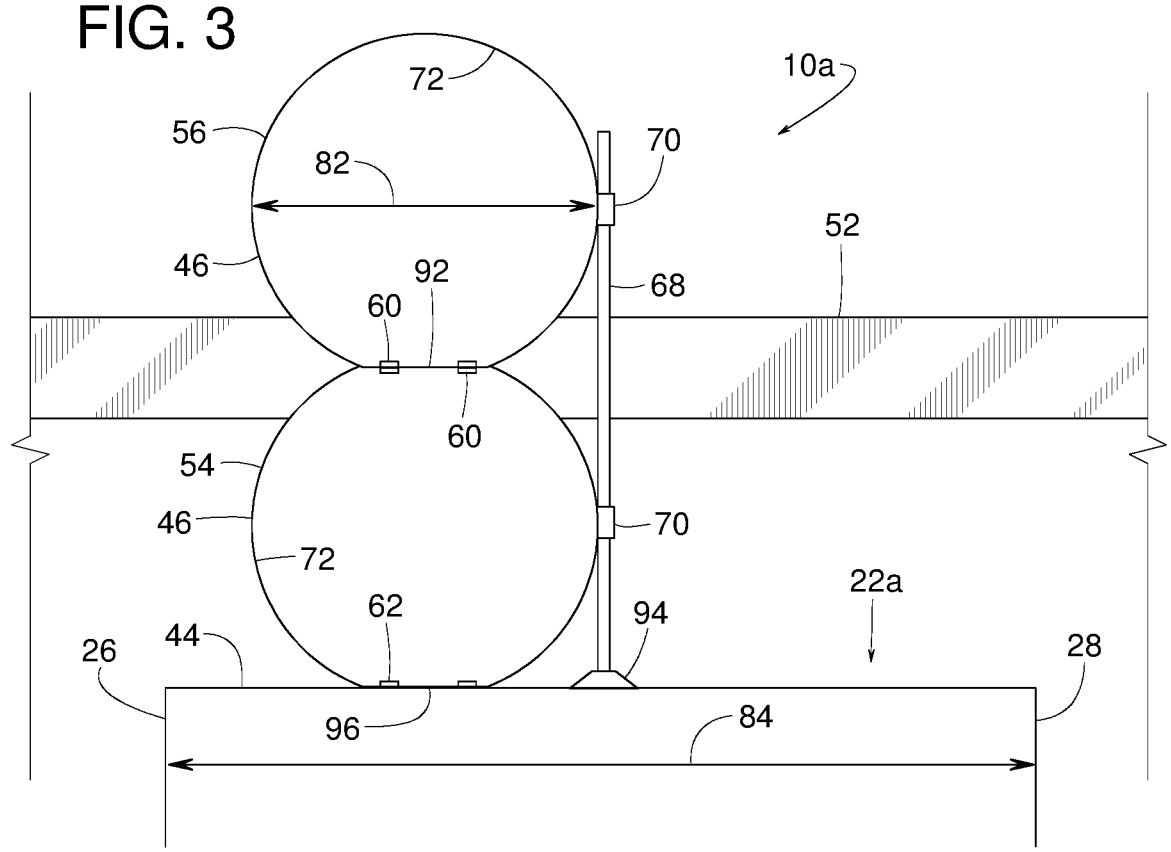
FIG. 3 is a cross-sectional view taken along line 3-3 of FIG. 2.
Figure 7:
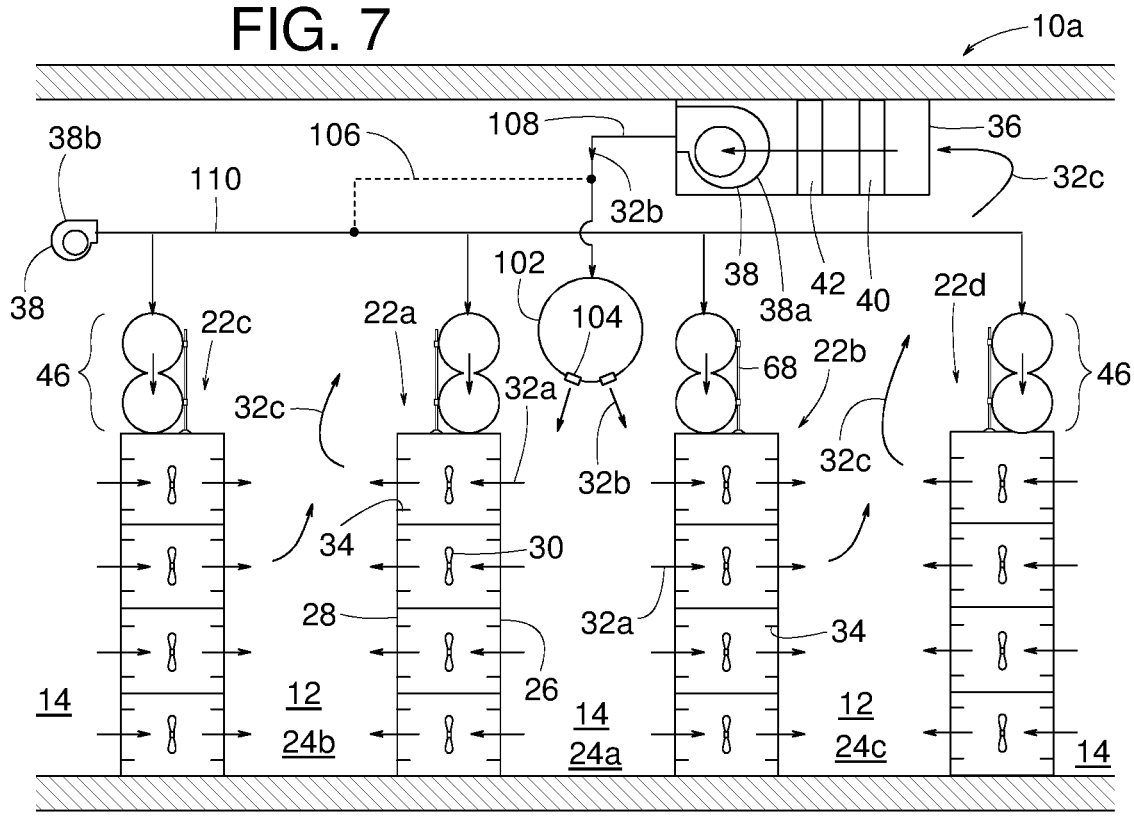
FIG. 7 is a cross-sectional view taken along line 7-7 of FIG. 2.

In the illustrated examples, multiple rows of computer cabinets 22 are arranged to create, for example, a first row of computer cabinets 22a, a second row of computer cabinets 22b, a third row of computer cabinets 22c and a fourth row of computer cabinets 22d. In some examples, the rows of computer cabinets 22 are spaced apart from each other to create multiple passageways 24 (e.g., a middle passageway 24a, a first outer passageway 24b, a second outer passageway 24c, and any number of additional passageways). Passageways 24 enable personnel to access computers 20 from a first or front side 26 and a second or back side 28 (FIGS. 3 and 7).

At least some the computers 20 and/or the cabinets 22 have a fan 30 that moves a current of air 32a from the first side 26, through an air passageway 34 defined by the computer cabinet 22 (e.g., through the computers 20), and out through the second side 28. The current of air 32a absorbs heat from the computer 20 as it passes through and/or across it, thereby preventing the computer 20 from overheating. The current of air 32a flowing generally from the computer's first side 26 to its second side 28, and absorbing heat in the process, is what creates an alternating arrangement of cold aisles 14 and hot aisles 12.

In some examples, the cold aisles 14 are the passageways 24 along the first side 26 of the computers 20 (e.g., the middle passageway 24a), and the hot aisles 12 are the passageways 24 along the second side 28 of the computers 20 (e.g., the outer passageways 24b, 24c). The data center 16 can include any number of hot aisles 12 and cold aisles 14. The terms "hot" and "cold", in reference to an aisle, means that the average air temperature of the hot aisle is greater than that of the cold aisle. The terms, "hot aisle" and "cold aisle" do not suggest that either aisle is at any particular absolute temperature. The terms, "relatively cool air" and "relatively cool current of air" refer to the air in a cold aisle (e.g., the cold aisle 14). Likewise, the terms, "relatively warm air" and "relatively warm current of air" refer to the air in a hot aisle (e.g., the aisle 12). In some examples, a relatively cool current of air is at ambient room temperature, while a relatively warm current of air is at a higher temperature than that. In some examples, a relatively warm current of air is at ambient room temperature, while a relatively cool current of air is at a lower temperature than that. In some examples, a relatively cool current of air is at a lower than ambient room temperature, while a relatively warm current of air is at a higher than ambient room temperature.

To prevent the computers 20 collectively from overheating the entire data center 16, an HVAC system 36 (e.g., see FIGS. 7 and 8) cools and circulates air 32 through the building 18. Some examples of the HVAC system 36 comprise a main blower 38a forcing air 32 through a filter 40 and a cooling coil 42 (e.g., a water, glycol, and/or refrigerant cooled heat exchanger). Cool air 32b discharged from the HVAC system 36 is directed into the cold aisles 14 between the rows of the computer cabinets 22. Warmer air 32c within the hot aisles 14 returns to the HVAC system 36 by way of convection and/or via return airducts.

Conditions that allow the warm air 32c to bypass the HVAC system 36 and instead return directly to cold aisle 14 reduce the HVAC system efficiency. Consequently, reducing (e.g., minimizing or preventing) the mixing of relatively warm air 32c in the hot aisles 12 with relatively cool air 32b in the cold aisles 14 can improve or maximize the overall efficiency of cooling the data center 16.

The example air barrier systems 10a-r provide various airflow barriers and other means for reducing (e.g., minimizing) short circuit intermixing of warm air 32c and cool air 32b. Structural feature irregularities, such as, for example, one computer cabinet 22a' being shorter than adjacent ones, can increase the complexity of the space and the barrier shape and/or flexibility necessary for improved (e.g., optimal) isolation of warm air 32c from cool air 32b. Moreover, the structural features, shapes, and arrangements can change over time. Some of the computer cabinets 22, for instance, might be added, removed, repositioned, and/or replaced by other computer cabinets 22 of different shapes and/or sizes. Electrical conduit, piping, lighting, ductwork, fire suppression systems, and/or other equipment in the vicinity of the cabinets 22 might also be added, removed, or changed.

Figure 2:
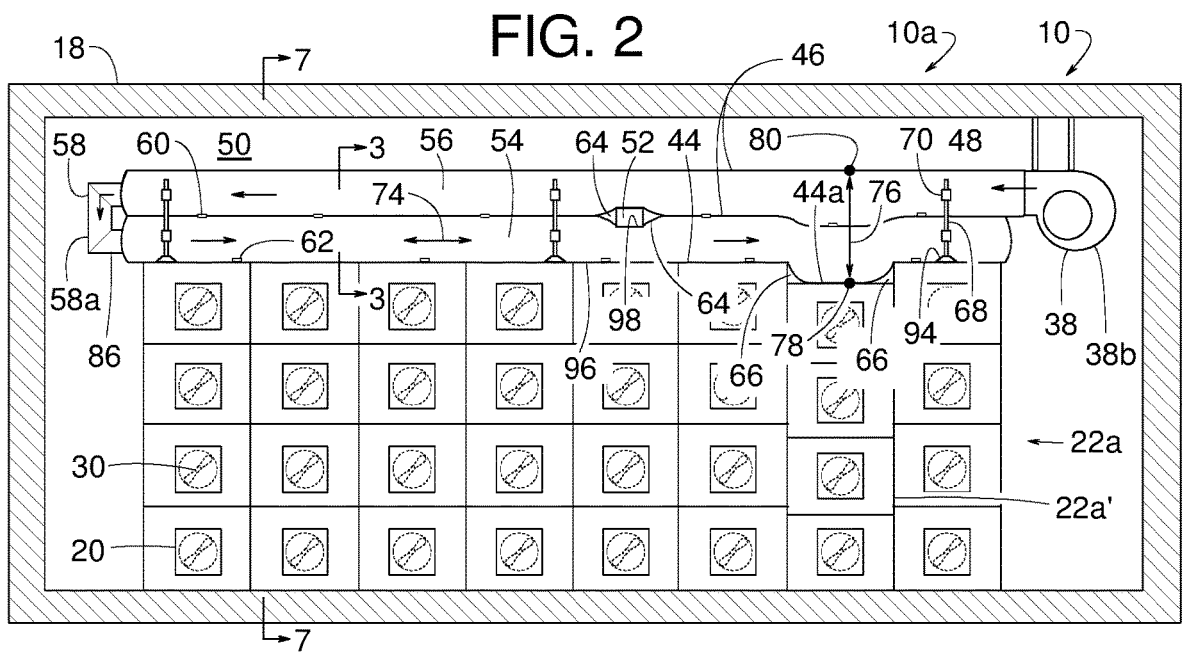
FIG. 2 is a side view similar to a cross-sectional view taken along line 2-2 of FIG. 1 including an example air barrier system set upon one of the rows of computer cabinets, wherein the example air barrier system is constructed in accordance with teachings disclosed herein.

In one example, FIGS. 2 and 3 show the air barrier system 10a resting upon a top surface 44 of the first row of computer cabinets 22a. The air barrier system 10a is shown being used for creating an inflatable airflow barrier 46 between the middle passageway 24a (the cold aisle 14) and the first outer passageway 24b (the hot aisle 12).

In this example, the top surface 44 of the computer cabinets 22a is below and spaced apart from an overhead surface 48 of the building 18 to define a gap 50 within which air barrier system 10a is interposed between the top surface 44 and the overhead surface 48. In some examples, the overhead surface 48 is the building's ceiling.

In the illustrated example, the computer cabinet's top surface 44 varies in height along its length with one area 44a of top surface 44 being lower than other areas due to the computer cabinet 22a' being shorter than other cabinets 22 in the row. Also, the illustrated examples of FIGS. 1 and 2 show an obstruction 52 extending over computer cabinets 22a. The obstruction 52 is schematically illustrated to represent any potentially interfering irregularity above the computer cabinet 22a. Some examples of the obstruction 52 include a pipe, a conduit, an airduct, a wire, a cable, a cable tray, etc. The air barrier system 10a is designed with flexibility to accommodate various examples of the obstruction 52 and seal over irregularities in the computer cabinet's top surface 44.

In some examples, the air barrier system 10a comprises at least a lower inflatable airduct 54, an upper inflatable airduct 56, and an airflow passage 58 (e.g., airflow passage 58a of FIG. 2 and airflow passage 58b of FIG. 4) between the lower and upper airducts 54, 56. Other examples of the air barrier system 10a include any number of stacked inflatable airducts 54, 56. Some examples of the air barrier system 10a further include a releasable connection 60 between the airducts 54, 56, a releasable connection 62 between the lower inflatable airduct 54 and the top surface 44 of the computer cabinets 22a, one or more block-off members 64 adjacent to the obstruction 52 and extending between inflatable airducts 54, 56, one or more block-off members 66 extending between the lower inflatable airduct 54 and the relatively low area 44a of the computer cabinet's top surface 44, one or more props 68 (e.g., a rod, a bar, a pole, a post, etc.), and/or one or more loops 70 or other means for connecting the props 68 to the inflatable airducts 54, 56.

The upper and lower airducts 54, 56 (and other inflatable airducts discussed with reference to other examples herein) are inflatable by virtue of their tubular wall 72 being made of a pliable material (e.g. air permeable sheet, air impermeable sheet, nonmetallic sheet, coated fabric, uncoated fabric, and various combinations thereof). The term, "pliable" refers to a material that can be deformed and later straightened without appreciable damage to the material. The term, "inflatable" as it relates to an airduct means that the internal volume of the airduct expands with internal air pressure and tends to collapse when the pressure is removed. In some examples, the pliable material of the tubular wall 72 is a lightweight polyester fabric weighing about 3.2 ounces per square yard. In some examples, the material is translucent to reduce (e.g., avoid) blocking room lighting in the building 18. In some examples, the material has an interwoven grid of carbon fiber for dissipating electrostatic charges.

Figure 5:
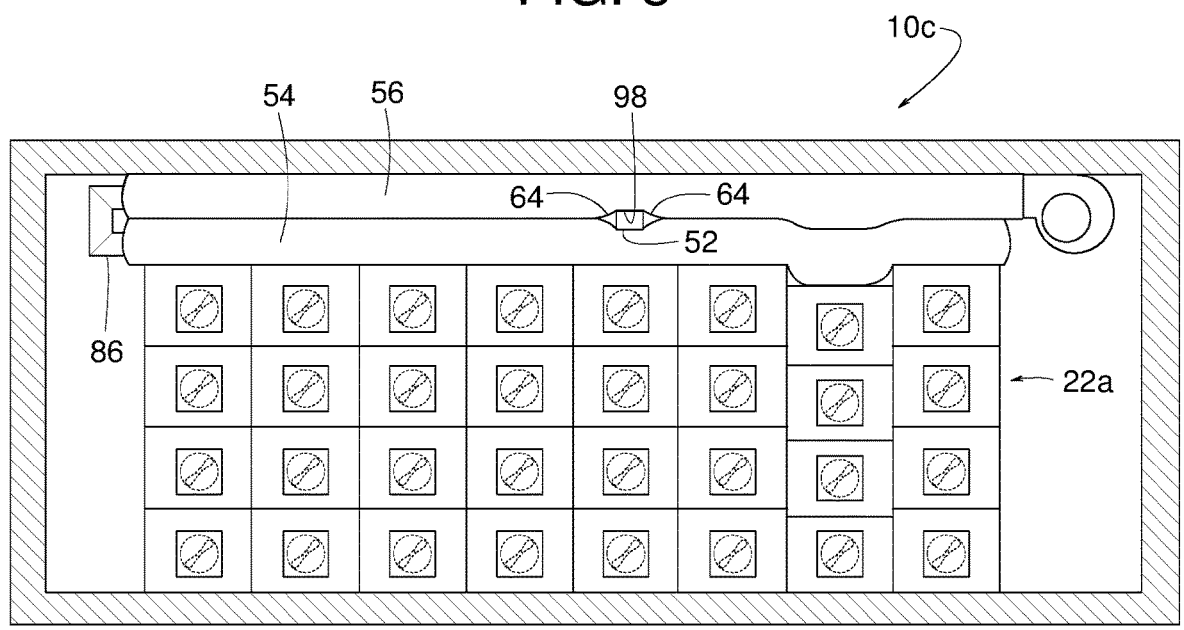
FIG. 5 is a side view similar to FIG. 2 but showing another example air barrier system constructed in accordance with teachings disclosed herein.
Figure 6:
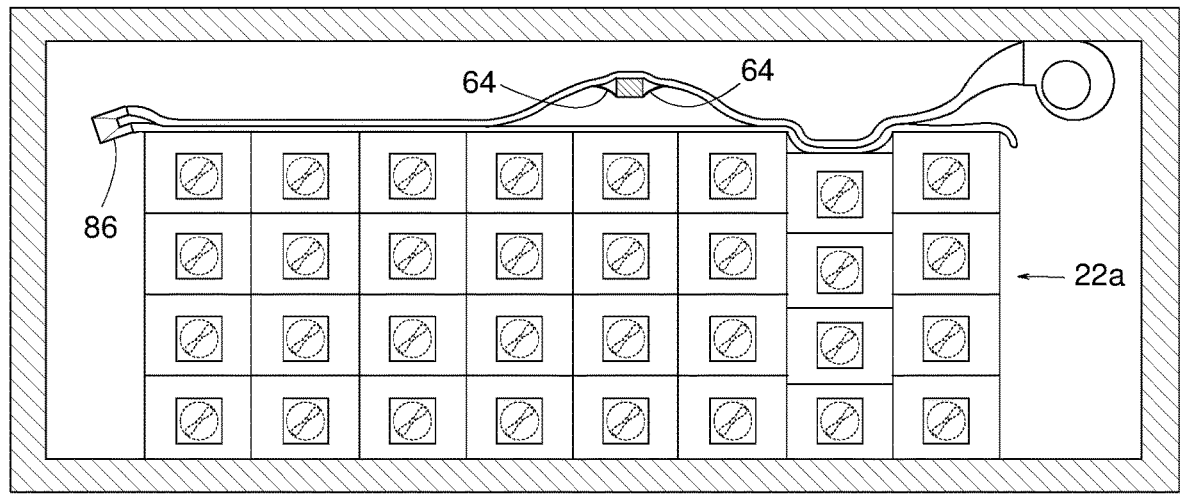
FIG. 6 is a side view similar to FIG. 5 but showing the example air barrier system in a deflated state.

In some examples, the upper and lower airducts 56, 54 (and any number of additional similar airducts) are elongate and/or have an axis that extends in a lengthwise direction 74 and are stacked to produce the inflatable barrier 46 with a desired barrier height 76 when inflated. The barrier height 76 is defined as the vertical distance from a lowermost point 78 of the lower inflatable airduct 54 to an uppermost point 80 of the upper inflatable airduct 56 when the airducts 54, 56 are in an inflated state. FIG. 5 shows an example inflated state, and FIG. 6 shows an example deflated state. When in the inflated state, the multiple stacked airducts 54, 56 provide the inflatable barrier 46 with a barrier width 82 extending in a horizontal direction substantially perpendicular to both the barrier height 76 and the lengthwise direction 74. In some examples, the barrier height 76 is greater than the barrier width 82 to achieve almost any desired height without having to extend the barrier 46 extensively widthwise or having to possibly extend beyond a horizontal depth 84 of the computer cabinets 22. That is, in some examples, the width 82 of the inflatable barrier 46 is less than the horizontal depth 84 of the computer cabinets 22.

Figure 8:
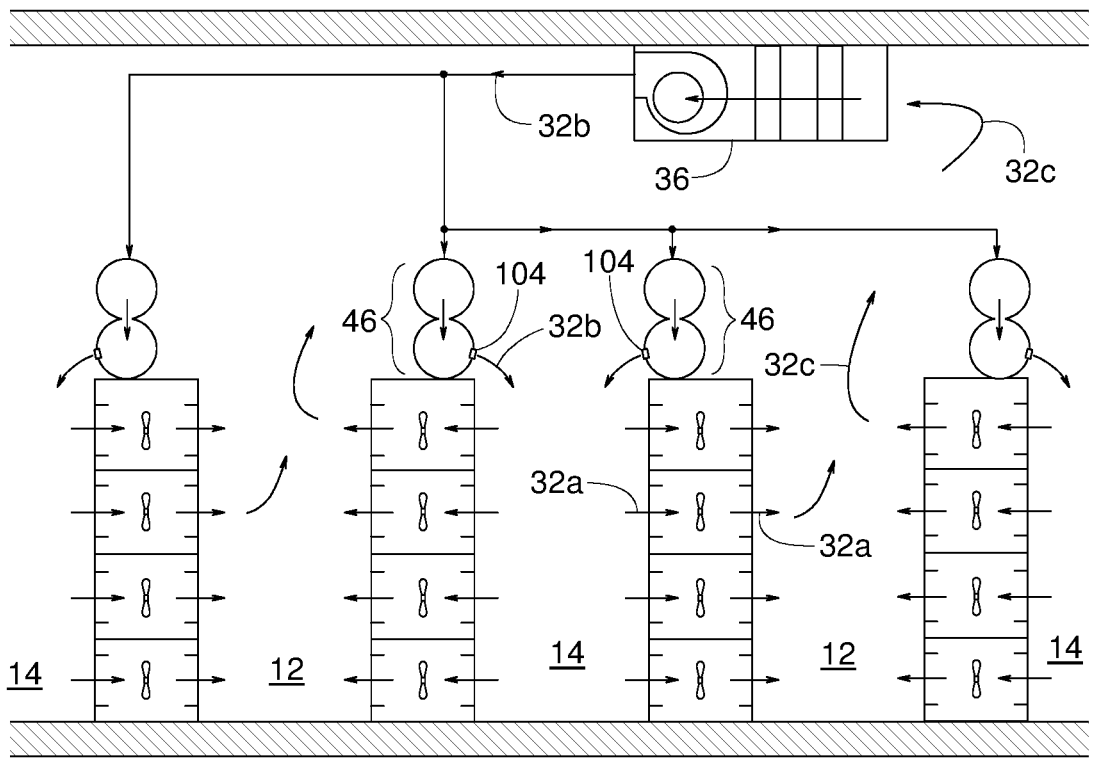
FIG. 8 is cross-sectional view similar to FIG. 7 but showing another example air barrier system constructed in accordance with teachings disclosed herein.

In some examples, a blower 38 inflates the barrier 46 by forcing air into the upper inflatable airduct 56 while an airflow passage 58 (e.g., the airflow passage 58a and/or the airflow passage 58b) conveys the forced air into the lower inflatable airduct 54. The airflow passage 58 is any means for interconnecting the two airducts 54 and 56 in fluid communication. In the example shown in FIGS. 2, 5, and 6, a C-shaped airduct 86 provides the airflow passage 58a. In the example shown in FIG. 4, a substantially horizontal panel 88 joining the airducts 54, 56 includes one or more openings 90 defining the airflow passage 58b. In some examples, the blower 38 is a main blower 38a of the HVAC system 36, as shown in FIG. 8. In other examples, the blower 38 is a secondary blower 38b solely dedicated to the inflation of barrier 46, as shown in FIG. 7.

Some examples of the air barrier system 10 include the releasable connection 60 at adjoining surfaces 92 of the airducts 54, 56 to ensure a tight yet separable seal in that area. The releasable connection 60 is schematically illustrated to represent any type of coupling that can be readily separated manually. In some examples, manually separating (or connecting) the connection 60 may be performed without tools (e.g., merely with the use of a person's hands and their own strength). Some examples of releasable connection 60 include magnets, a hook-and-loop fastener, a zipper, a snap, and/or a zip tie. A sewn seam and a thermally bonded joint are some examples of non-releasable connections.

In some examples, the panel 88 (FIG. 4) joins the airducts 54, 56 and is stiffer than the material of the airducts 54, 56. The relative stiffness of the panel 88 can increase the overall rigidity of the inflatable barrier 46.

In addition or alternatively, some examples of the air barrier system 10 include one or more props 68 to help hold the inflatable barrier 46 generally upright. In some examples, the props 68 feed through the loops 70 (fabric, metal or plastic) attached to the airducts 54, 56. A sliding fit between the props 68 and the loops 70 provide desirable slippage as the airducts 54, 56 change between their inflated and deflated states. In some examples, a foot 94 at the bottom of each prop 68 provides broad support of the prop 68 on the top surface 44 of the computer cabinets 22. To further stabilize the prop 68 and the inflatable barrier 46, some examples of the foot 94 are magnetic and attracted to ferrous metal versions of the computer cabinets 22, other examples are suction cups.

The flexibility of the inflatable barrier 46 enables a sealing surface 96 on the underside of the lower airduct 54 to seal down against the top surface 44 of the computer cabinets 22, even if the top surface 44 varies in height along its length. To further enhance the sealing engagement between the inflatable barrier 46 and the computer cabinet's top surface 44, some examples of the barrier 46 include the releasable connection 62 between the lower inflatable airduct 54 and the top surface 44 of the computer cabinets 22a. The releasable connection 62 is schematically illustrated to represent any type of coupling that can be readily separated manually. In some examples, manual separating (or connecting) the connection 62 may be performed without tools (e.g., merely with the use of a person's hands and their own strength). Some examples of the releasable connection 62 include magnets, a hook-and-loop fastener, a zipper, a snap, a suction cup, and/or a zip tie.

The flexibility of the inflatable barrier 46 also enables the airducts 54, 56 to conformingly seal around various examples of the obstruction 52, as shown in FIGS. 2 and 5. The separation of airducts 54, 56 in the area of the obstruction 52 creates an obstruction-accommodating opening 98 between the airducts 54, 56. The opening 98 is the space through which obstruction 52 extends. The pliable walls of the airducts 54, 56 enable the barrier to conform to the shape of the obstruction 52, so the opening 98 is relatively similar in shape and size to the obstruction 52 itself.

To thoroughly seal around the obstruction 52 when the opening 98 does not sufficienctly fit the shape of the obstruction 52, some examples of the air barrier system 10 include one or more blocking members 64 in sealing contact between the airducts 54, 56 and the obstruction 52. The blocking member 64 is schematically illustrated to represent any structure that can fill an air gap between the inflatable barrier 46 and the obstruction 52. Some examples of the blocking member 64 include a generally triangular-shaped sheet of material, a resiliently compressible foam block, etc.

To enhance sealing in an area between the lower inflatable airduct 54 and the relatively low area 44a of the computer cabinet's top surface 44, some examples of the air barrier system 10 include one or more blocking members 66 extending downward from the lower airduct 54 to seal against the computer cabinet's relatively low area 44a. The blocking member 66 is schematically illustrated to represent any structure that can fill an air gap between the inflatable barrier 46 and the top surface 44 of the cabinet. Some examples of the blocking member 66 include a generally triangular-shaped sheet of material, a resiliently compressible foam block, etc.

Some example means for inflating the barrier 46 while supplying cool air 32b to the cold aisles 14 are shown in FIGS. 7 and 8. In the example shown in FIG. 7, the main blower 38a of the HVAC system 36 discharges cool air 32b into one or more primary airducts 102 (e.g., an inflatable airduct, a conventional relatively rigid sheet metal airduct, etc.). The airducts 102 include one or more air dischargers 104, schematically illustrated to represent any suitable feature for releasing and distributing cool air 32b from the airduct into each cold aisle 14. Some examples of the air dischargers 104 include a series of apertures, a series of discharge nozzles, a porous air permeable duct wall or portion thereof, and various combinations thereof. In the example illustrated in FIG. 7, the barriers 46 are inflated by one or more secondary blowers 38b. Having separate blowers 38a, 38b can simplify the ductwork in some example applications and can facilitate retrofitting existing data centers with the inflatable barriers 46.

In some examples, an airduct 106 (dashed line in FIG. 7) connects a supply airduct 108 of the main blower 38a to an airduct 110 that feeds the inflatable barriers 46. This allows the secondary blower 38b to be omitted. With the addition of the airduct 106, the main blower 38a of HVAC system 36 is then used for inflating the barriers 46 as well used for inflating inflatable versions of the primary airducts 102, thus the secondary blower 38b is no longer needed.

In the example shown in FIG. 8, the main blower 38a discharges cool air 32b into the inflatable barriers 46. In this example, the inflatable barriers 46 include air dischargers 104 (e.g., apertures, discharge nozzles, porous air permeable duct wall or portions thereof, or various combinations thereof, etc.) for releasing the cool air 32b into the cold aisles 14. The cool air 32b in the cold aisles 14 passes through the computer cabinets 22 and then returns to the HVAC system 36 as warmer air 32c. The inflatable barriers 46 with the dischargers 104 eliminate the need for a separate, dedicated primary airduct 102 for delivering cool air 32b to the cold aisles 14.

FIGS. 9-12 show example air barrier systems 10e, 10f, which include at least one airduct extension 112 extending from a manifold airduct 118 for creating a barrier 114 between hot and cold aisles 12, 14. In the illustrated examples, the axis of the airduct extension 112 is substantially perpendicular to the axis of the manifold airduct 118. In other examples, the airduct extension 112 can extend from the manifold airduct 118 at an angle other than 90 degrees. In some examples, the airduct extensions 112 are inflatable by virtue of their tubular wall 116 being made of a pliable material (e.g. air permeable sheet, air impermeable sheet, nonmetallic sheet, coated fabric, uncoated fabric, and various combinations thereof). In some examples, the pliable material of the tubular wall 116 is a lightweight polyester fabric weighing about 3.2 ounces per square yard. In some examples, the material is translucent to reduce (e.g., avoid) blocking room lighting in the building 18. In some examples, the material has an interwoven grid of carbon fiber for dissipating electrostatic charges. In some examples, the airduct extension 112 is simply one or more sheets of material.

Some illustrated examples of the airduct extensions 112 include first and second inflatable airduct extensions 112a, inflatable airduct extensions 112b (similar to airduct extensions 112a but with a longer axial dimension), a single extra wide full axial length inflatable airduct extension 112c, and/or a plurality of narrower full axial length inflatable airduct extensions 112d. In the example shown in FIGS. 9-12, the discharge air 32 from the blower 38b flows into and through the inflatable manifold airduct 118 to inflate the inflatable airduct extensions 112, which are suspended from the manifold airduct 118. In response to the forced discharge air 32, the inflatable airduct extensions 112 expand horizontally widthwise (radially) to seal sideways against each other and expand vertically lengthwise (axially) to seal down against the computer cabinet's top surface 44. The expansion also makes the individual airduct extensions 112 and the overall barrier 114 more rigid than when in a deflated state.

Some examples of the inflatable barrier systems 10e, 10f include at least one releasable connection 120 (e.g., a magnet, a hook-and-loop fastener, a zipper, a snap, a zip tie, etc.) for ensuring a tight yet separable seal in certain areas. Some example locations of the releasable connection 120 include between adjacent airduct extensions 112, between the bottom of the airduct extension 112 and the computer cabinet's top surface 44, between the airduct extension 112*b* and a vertical sidewall 122 of the computer cabinet 22, and/or between the airduct extension 112*d* and a wall 124 or other structure inside the building 18, among others. More particularly, as shown in the illustrated example, the extra wide full axial length inflatable airduct extension 112*c* is dimensioned to have a width substantially equal to or slightly greater than a spacing between two adjacent cabinets 22 to fill a gap produced when one cabinet is missing or excluded from the full row of computer cabinets 22*a*. In some examples, the collective width of the plurality of narrower full axial length inflatable airduct extensions 112*d* is dimensioned to have a width substantially equal to or slightly greater than the spacing between an end of the row of cabinets 22*a* and the wall 124 of the building 18. In some examples, the plurality of narrower airduct extensions 112*d* may be used instead of the extra wide airduct extension 112*c*. Likewise, in some examples, the extra wide airduct extension 112*c* may be used instead of the plurality of narrower airduct extensions 112*d*. Further, in some examples, extra wide airduct extensions (similar to the extensions 112*c*) that do not extend a full axial length (e.g., from the manifold to a floor of the building 18) may be used instead of some or all of the airduct extensions 112*a* that interface with the top surface 44 of the cabinets 22*a*.

Figure 9:
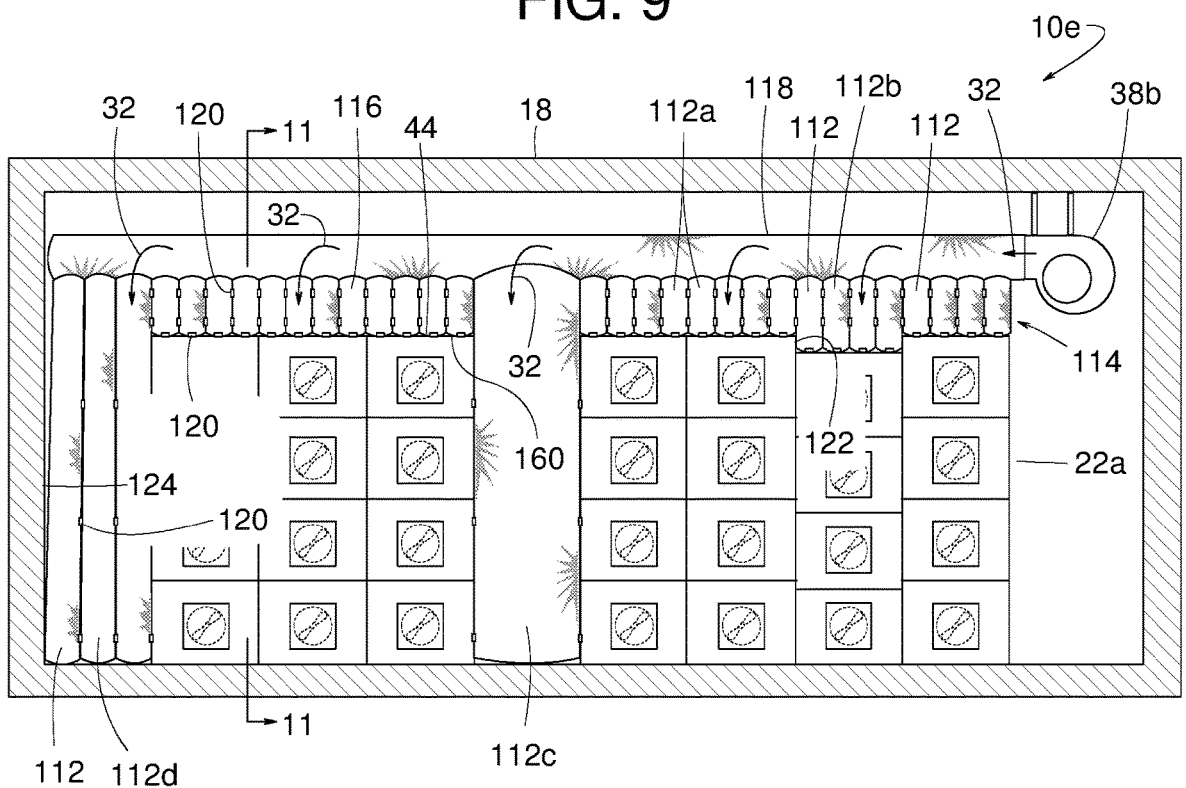
FIG. 9 is a side view similar to FIG. 2 but showing another example air barrier system constructed in accordance with teachings disclosed herein.
Figure 10:
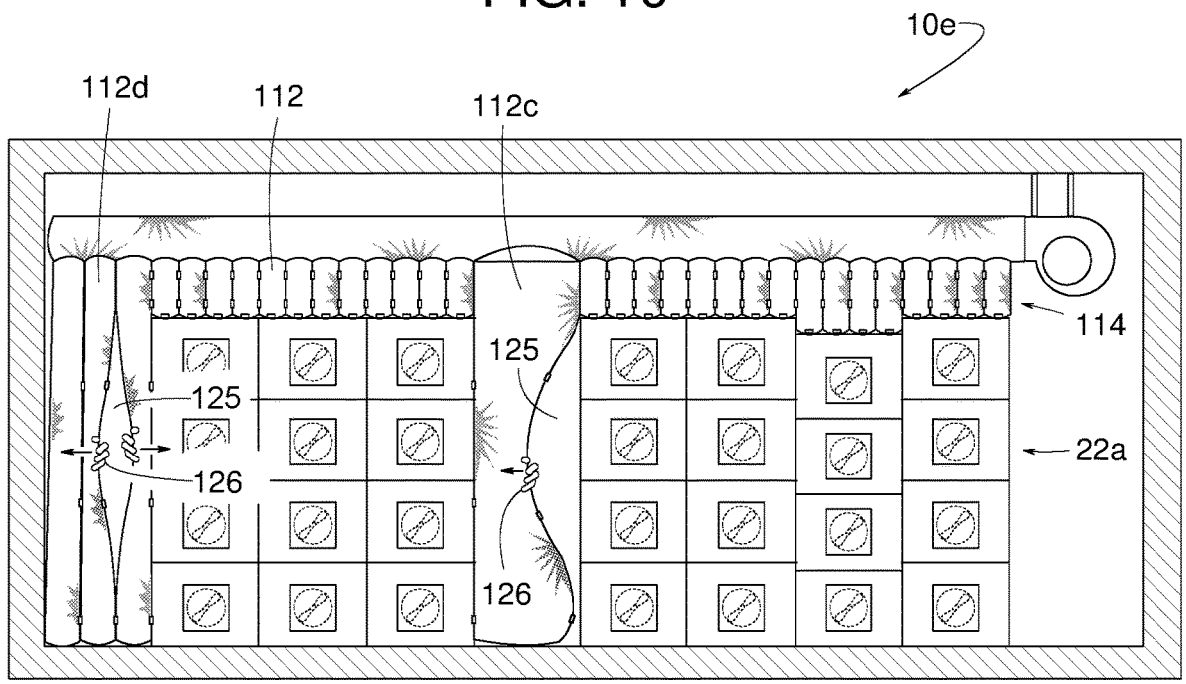
FIG. 10 is another view of the example air barrier system shown in FIG. 9 but showing some barriers deflected to create walk-through openings.

In some examples, the inflated airduct extensions 112 can be manually deflected. FIG. 10, for example, shows a hand 126 manually moving airduct extensions 112*c*, 112*d* aside to create openings 125 that can allow access for personnel and/or equipment between aisles. FIG. 10 shows the air barrier system 10*e* in an open configuration, and FIG. 9 shows the air barrier system 10*e* in a closed configuration sealing off the walk-through opening 125.

Figure 11:
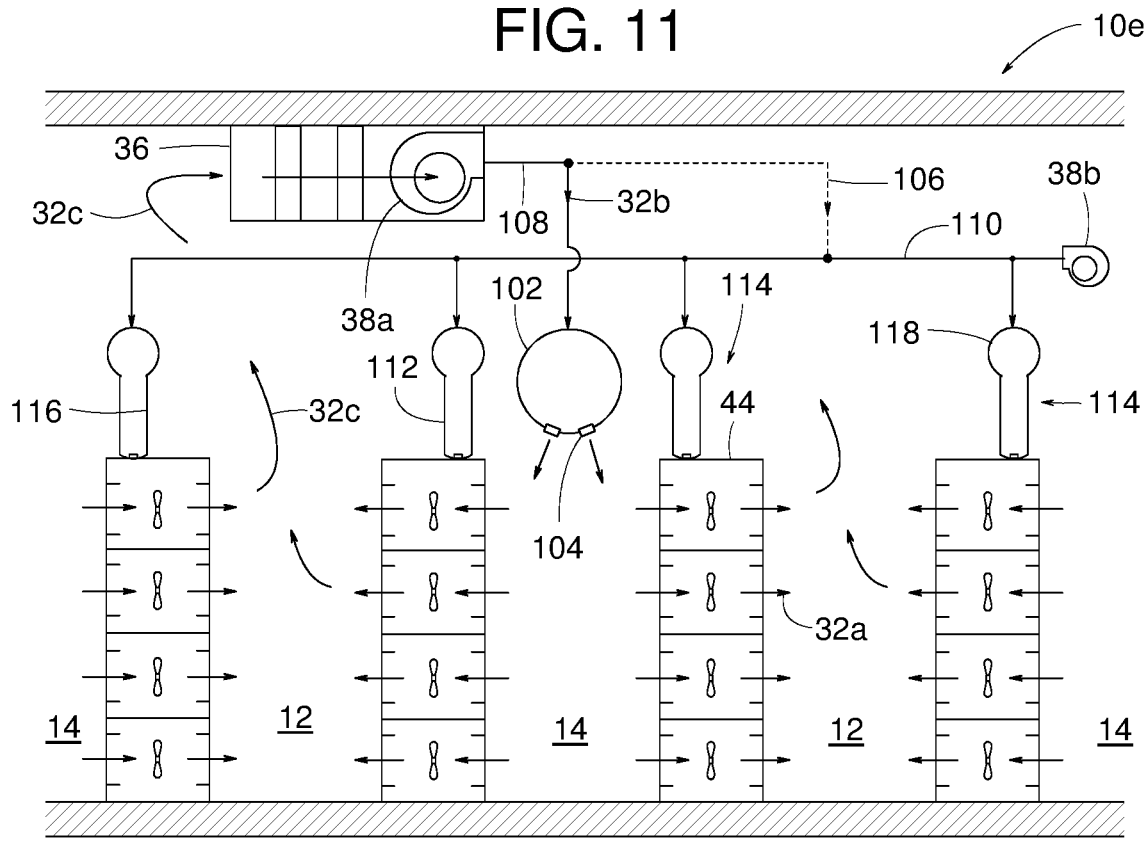
FIG. 11 is a cross-sectional view taken along line 11-11 of FIG. 9.
Figure 12:
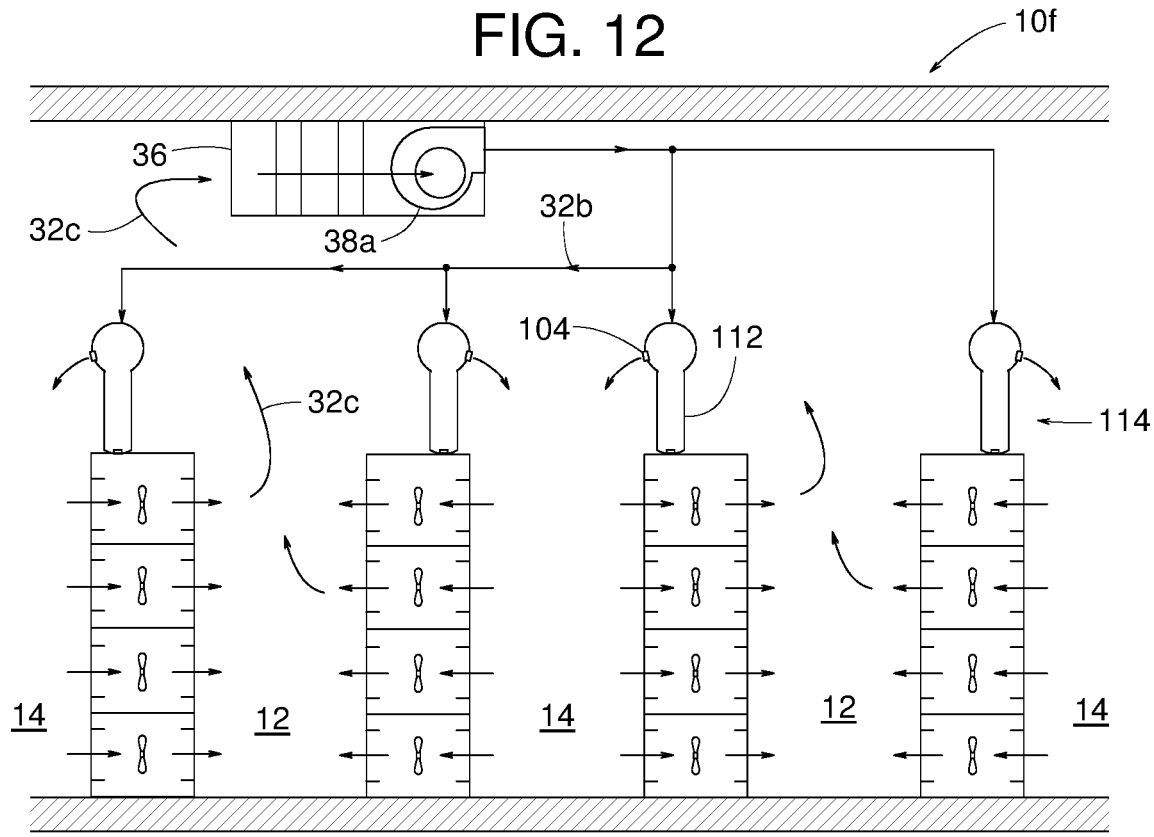
FIG. 12 is a cross-sectional view similar to FIG. 11 but showing another example air barrier system constructed in accordance with teachings disclosed herein.

Some example systems for inflating the barrier 114 while supplying cool air to the cold aisles 14 are shown in FIGS. 11 and 12. In the example shown in FIG. 11, the main blower 38*a* of the HVAC system 36 discharges cool air 32*b* into one or more primary airducts 102 (e.g., an inflatable airduct, a conventional relatively rigid sheet metal airduct, etc.). The airducts 102 include air dischargers 104 (e.g., a series of apertures, a series of discharge nozzles, a porous air permeable duct wall or portions thereof, or various combinations thereof, etc.) for releasing the cool air 32*b* into the cold aisles 14. In the example illustrated in FIG. 11, the barriers 114 are inflated by one or more secondary blowers 38*b*. Having separate blowers 38*a*, 38*b* can simplify the ductwork in some example applications and can facilitate retrofitting existing data centers with the barriers 114. In other examples, however, an airduct 106 (dashed line in FIG. 11) connects a supply airduct 108 of the main blower 38*a* to an airduct 110 that feeds the inflatable barriers 114. This allows the secondary blower 38*b* to be omitted. With the addition of the airduct 106, the main blower 38*a* of the HVAC system 36 is then used for inflating the barriers 114 as well used for inflating the inflatable versions of primary airducts 102, thus the secondary blower 38*b* is no longer needed.

In the example shown in FIG. 12, the main blower 38*a* discharges cool air 32*b* into the inflatable barriers 114. In this example, the inflatable barriers 114 include the air dischargers 104 for releasing the cool air 32*b* into the cold aisles 14. The cool air 32*b* in the cold aisles 14 passes through the computer cabinets 22 and then returns to the HVAC system 36 as warmer air 32*c*. The inflatable barriers 114 with the dischargers 104 eliminate the need for the secondary blower 38*b*.

Figure 13:
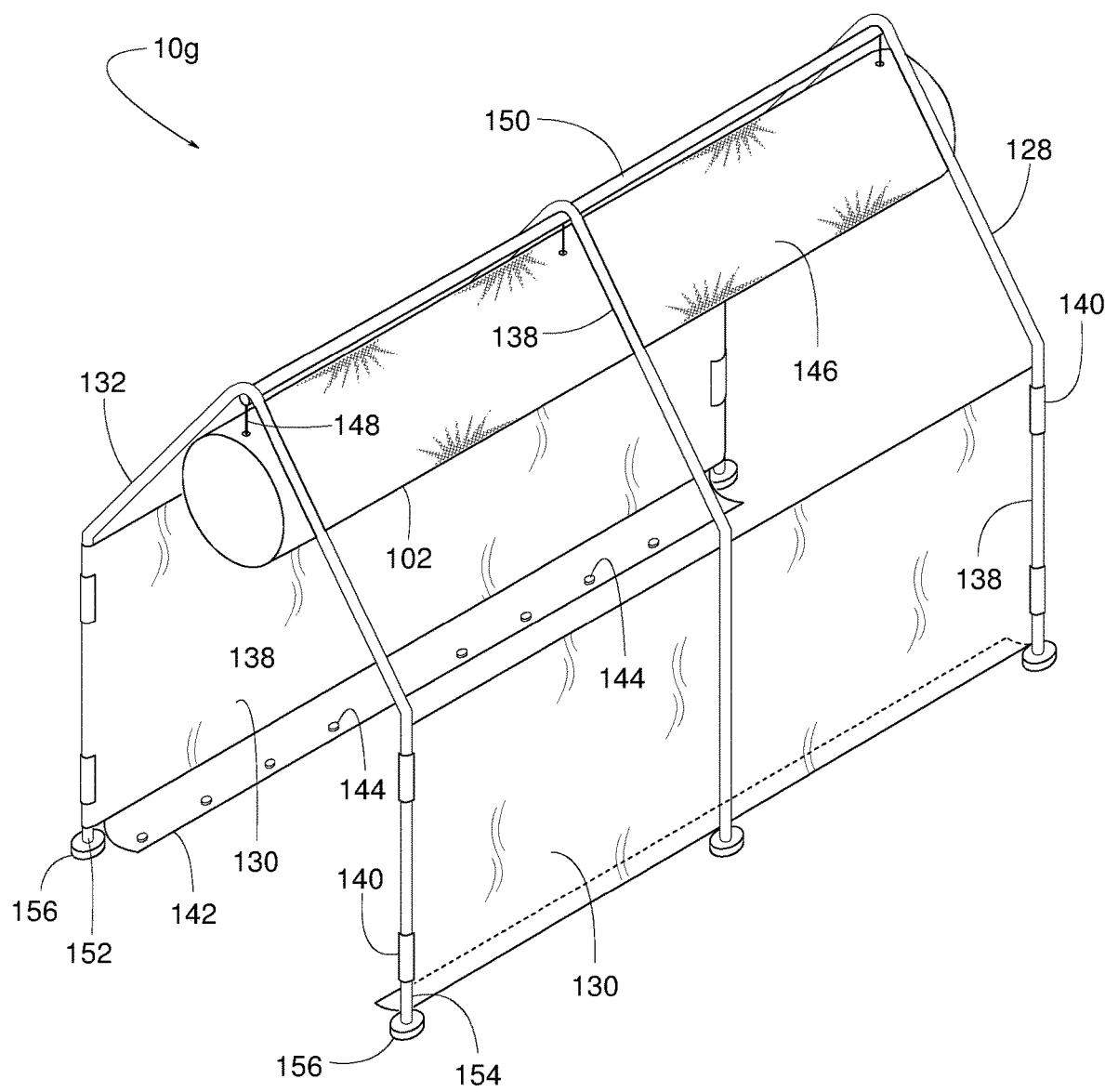
FIG. 13 is a perspective view of another example air barrier system constructed in accordance with teachings disclosed herein.
Figure 14:
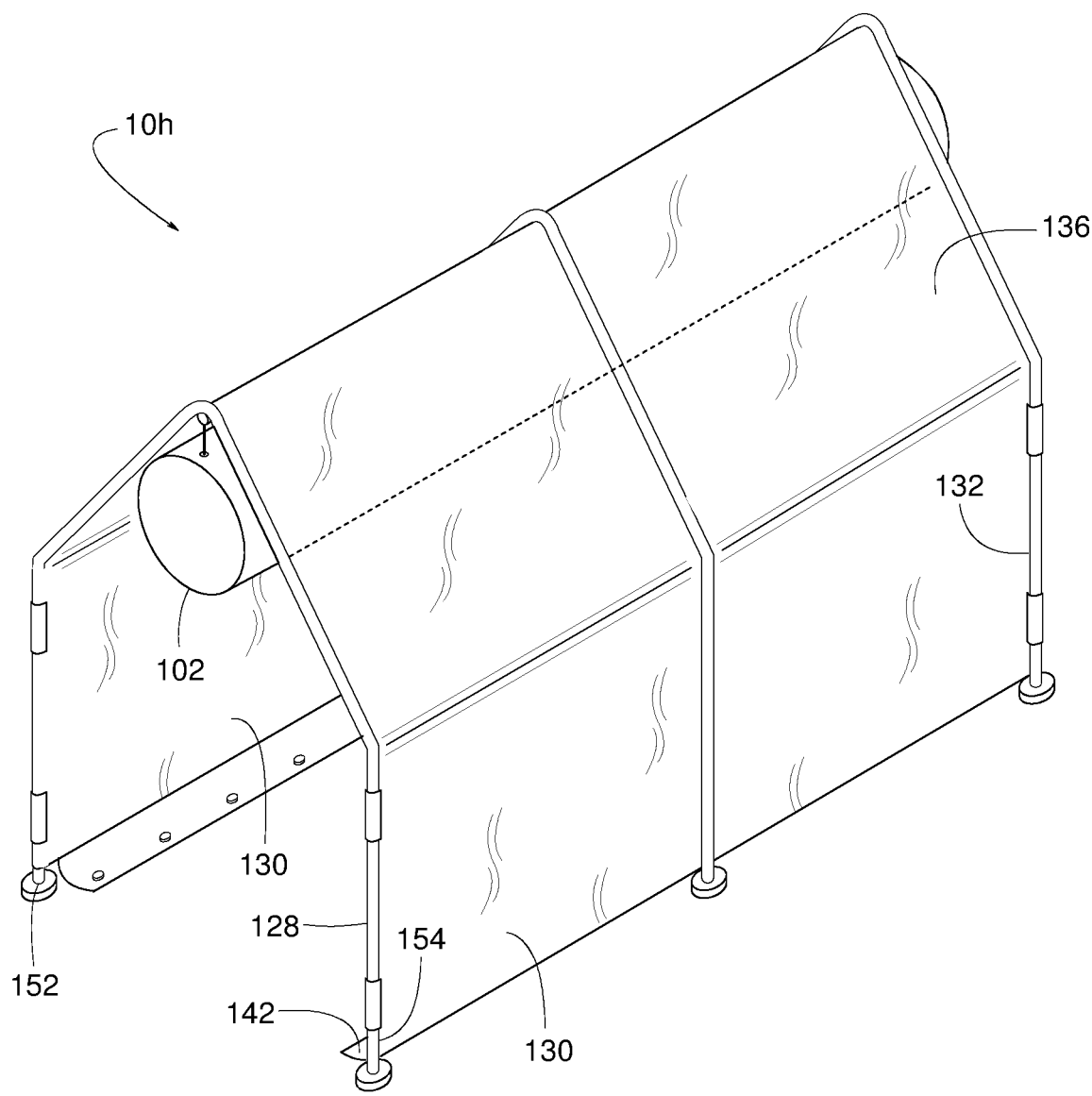
FIG. 14 is a perspective view of yet another example air barrier system constructed in accordance with teachings disclosed herein.
Figure 15:
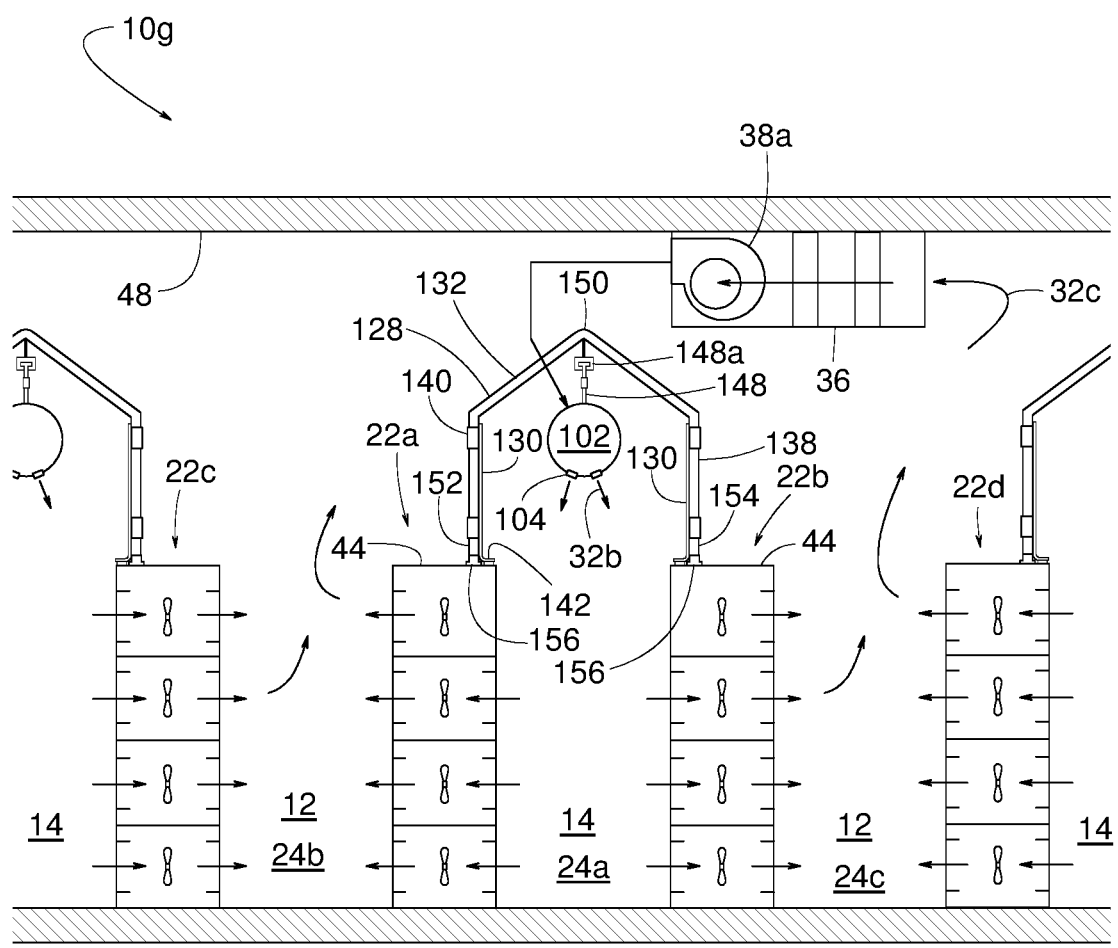
FIG. 15 is a cross-sectional view similar to FIGS. 7, 8, 11 and 12 but showing the example air barrier system of FIG. 13 installed on top of rows of computer cabinets.

FIGS. 13-15 show example air barrier systems 10*g*, 10*h* that include a structure 128 that is supported by (e.g., rests upon) the computer cabinets 22. In some examples, the structure 128 supports at least one side barrier 130 between the hot and cold aisles 12, 14. More particularly, in some examples, the barrier 130 partitions an area above the computer cabinets to reduce the mixing of air between the hot and cold aisles 12, 14. In the example shown in FIG. 13, the structure 128 comprises two side barriers 130 (e.g., a first side barrier and a second side barrier) attached to a frame 132. In some examples, an airduct 102 is suspended underneath the structure 128 for supplying cool air 32*b* from the HVAC system 36 to the cold aisle 14. In other examples, the airduct 102 returns warm air 32*c* from the hot aisle 12 to the HVAC system 36*c*.

In the example shown in FIG. 13, the structure 128 is open at the top so as not to interfere with certain fire suppression systems of the data center 16. Other examples of the structure 128, as shown in FIG. 14, include at least one roof barrier 136 for ensuring the separation of air between the hot and cold aisles 12, 14. In some examples, the roof barrier 136 is unitarily formed with the side barrier 130. In other examples, the roof barrier 136 is separate from the side barrier 130.

The actual construction details of the structure 128 may vary. In some examples, the frame 132 comprises tubes 138 made of relatively rigid material (e.g., steel, aluminum, plastic, etc.), while the side barrier 130 and/or the roof barrier 136 are made of a pliable sheet of material (e.g., a lightweight polyester fabric weighing about 3.2 ounces per square yard). As used herein, a "tube" means any relatively rigid and elongate member, which may be hollow or solid and have any suitable cross-sectional shape. The frame 132, in this example, is stiffer than the lightweight material of the side barrier 130 and the roof barrier 136. In some examples, the lightweight material is translucent to reduce (e.g., avoid) blocking room lighting in the building 18. In some examples, the lightweight material has an interwoven grid of carbon fiber for dissipating electrostatic charges. Some examples of the structure 128 include suitable fasteners 140 (e.g., clips, clamps, bands, magnets, hook-and-loop fasteners, zippers, snaps, zip ties, etc.) for securing the side barrier 130 and/or the roof barrier 136 to the frame 132. In some examples, the fasteners 140 are releasable connectors structured to be easily removed, thereby enabling a user to assemble and disassemble the structure 128 with relatively limited effort.

Some examples of the structure 128 include a lip 142. The lip 142 can be made of the same lightweight fabric material as that of side barrier 130 and may be a unitary extension therefrom or a separate piece of pliable material attached to side barrier 130 using any suitable means (e.g., adhesive, sewing, hook and loop fasteners, a zipper, etc.). The flexibility and compliance of the lip 142 allows it to effectively seal the space between the side barrier 130 and the computer cabinets 22 even if the top surface 44 has some irregularities. FIGS. 13-15 show the lip 142 being deflectable out of coplanar alignment with the first side barrier 130. In some examples, this allows the lip 142 to bend outward to lie generally flat down against the top surfaces 44 of the computer cabinets 22 and thereby provide an effective seal even if the top surfaces 44 have some irregularities. Additionally or alternatively, the lip 142 may hang or extend over an edge of cabinets 22 and below the top surface 44 of the cabinets 22 adjacent the side of the cabinets 22 aligning a corresponding aisle 12, 14.

To further ensure an effective sealing engagement between the lip 142 and the computer cabinets 22, some examples of the structure 128 include a releasable connection 144 (magnets, a hook-and-loop fastener, a zipper, a snap, a zip tie, a suction cup, etc.) between the lip 142 and the top surface 44 of the computer cabinets (or the side surface of the cabinets 22 if the lip 142 extends over the edge of the cabinets). In some examples, a similar releasable connection 144 connects the side barrier 130 and/or the roof barrier 136 to the frame 132. In some examples, the releasable connection 144 may be manually connected or separated without the use of tools (e.g., merely with the use of a person's hands and their own strength).

Some examples of the airduct 102 are inflatable by virtue of their tubular wall 146 being made of a pliable material (e.g. air permeable sheet, air impermeable sheet, nonmetallic sheet, coated fabric, uncoated fabric, and various combinations thereof). In some examples, the pliable material of tubular wall 146 is a lightweight polyester fabric weighing about 3.2 ounces per square yard. In some examples, the material is translucent to reduce (e.g., avoid) blocking room lighting in the building 18. In some examples, the material has an interwoven grid of carbon fiber for dissipating electrostatic charges. Some examples of the airduct 102 include air discharge means 104 (e.g., apertures, discharge nozzles, porous air permeable duct wall, etc.) for passing air (e.g., the air 32b, 32c) between the interior and exterior of the airduct 102.

Some examples of the airduct 102 are made of a relatively rigid material, such as sheet metal. Rigidity helps prevent the airduct 102 from collapsing when the airduct 102 is used for returning warm air 32c at subatmospheric pressure back to the HVAC system 36. In some examples, the tubular wall 146 of the airduct 102 is made of a pliable material that is held in an expanded shape by relatively rigid hoops and/or other comparable mechanical structures. Mechanically holding the airduct 102 open makes inflatable versions of the airduct 102 suitable for conveying return air 32c to the HVAC system 36.

In some examples, hangers 148 suspend the airduct 102 directly from a peak 150 of the frame 132. The hangers 148 are schematically illustrated to represent any member coupled to the structure 128 and supporting at least some weight of the airduct 102. In some examples, the hangers 148 suspend the airduct 102 from a track 148a, which in turn is coupled to the frame 132. In other examples, the hangers 148 are omitted, and the airduct 102 is attached directly to the frame 132 with fasteners, just underneath the peak 150.

FIG. 15 shows the structure 128 installed on top of two rows of computer cabinets 22a, 22b. In this example, a first leg 152 of the frame 132 rests on a first top surface 44 of the first row of computer cabinets 22a, and a second leg 154 of the frame 132 rests on a second top surface 44 of the second row of computer cabinets 22b. In some examples, the feet 156 on the legs 152, 154 broaden the structure's weight distribution on the computer cabinet's top surface 44 and stabilize the structure 128. In some examples, a releasable connection (e.g., magnets, a hook-and-loop fastener, a snap, a suction cup, etc.) between the feet 156 and the top surface 44 helps hold the structure 128 in place. In some examples, the releasable connection between the feet 156 and the cabinets 22 may be manually connected or separated without the use of tools (e.g., merely with the use of a person's hands and their own strength). In the illustrated examples, the structure 128 is spaced apart from (e.g., not supported by) the overhead surface 48 and/or other structural members of the building 18. Thus, in some examples, a full weight of the structure 128 is supported by the cabinets 22. Providing releasable connections 140, 144, 156 between the different components of the structure 128 and the cabinets 22 as well as the fact that the structure 128 remains below and detached from the overhead surface 48 simplifies both the installation of the structure 128 as well as any subsequent modifications thereto because such installation and/or modification does not require any appreciable modification to the cabinets 22 or other structural components of the building 18.

The example of FIG. 15 shows the data center 16 with the middle passageway 24a, the first outer passageway 24b and the second outer passageway 24c. In this example, the middle passageway 24a is a cold aisle 14, and the outer passageways 24b, 24c are hot aisles 12. In other examples, the middle passageway 24a is a hot aisle 12, and the outer passageways 24b, 24c are cold aisles 14. In the illustrated example, the first row of computer cabinets 22a is between the middle passageway 24a and the first outer passageway 24b. The second row of computer cabinets 22b is between the middle passageway 24a and the second outer passageway 24c.

In the example shown in FIG. 15, the main blower 38a of the HVAC system 36 discharges cool air 32b into the main airduct 102, which distributes the cool air 32b into the middle passageway 24a (e.g., the cold aisle 14). The air 32b passes through the computer cabinets 22 and thereby becomes warm air 32c that enters the outer passageways 24b, 24c (e.g., the hot aisles 12). From there, the warm air 32c returns to the HVAC system 36 via convection and/or via a return airduct.

In some examples, the main airduct 102 is inflatable with a pliable tubular wall material made of a lightweight polyester fabric. The lightweight material allows the structure 128 to safely transfer the weight of the main airduct to the computer cabinets 22.

Figure 4:
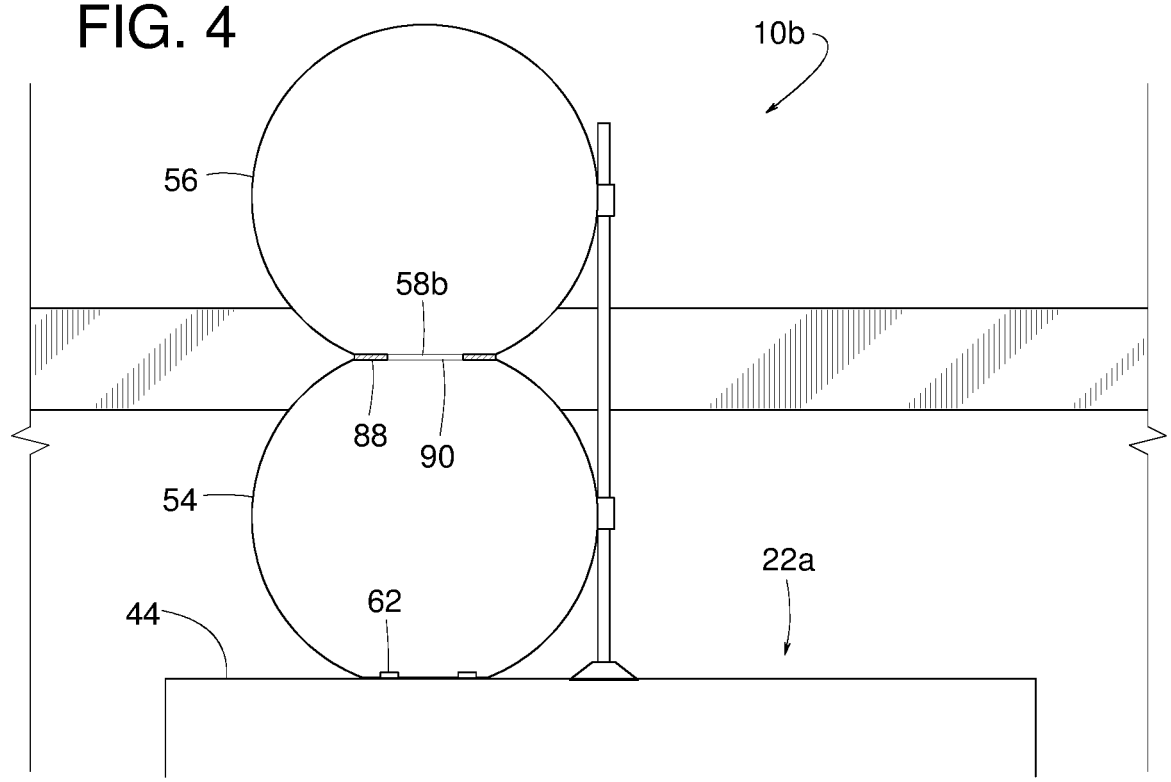
FIG. 4 is a cross-sectional view similar to FIG. 3 but showing another example air barrier system constructed in accordance with teachings disclosed herein.
Figure 16:
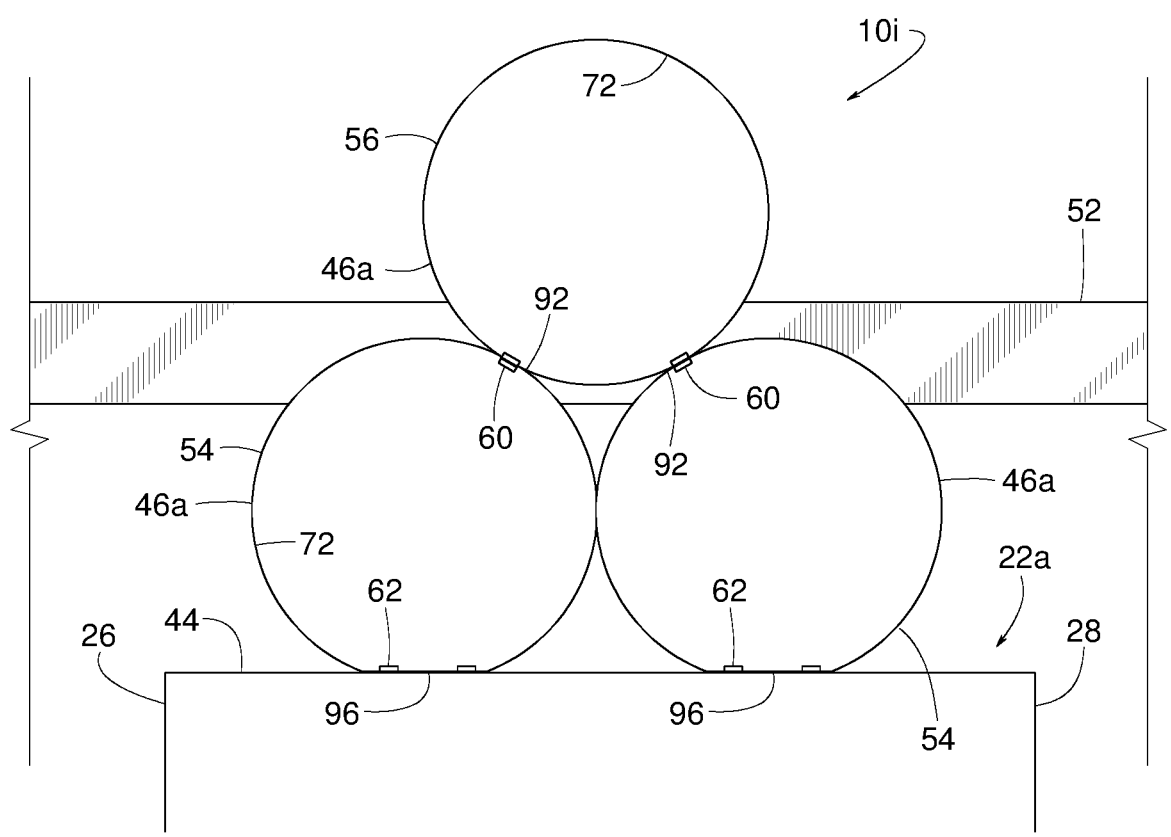
FIG. 16 is a cross-sectional view similar to FIG. 3 but showing another example air barrier system constructed in accordance with teachings disclosed herein.
Figure 17:
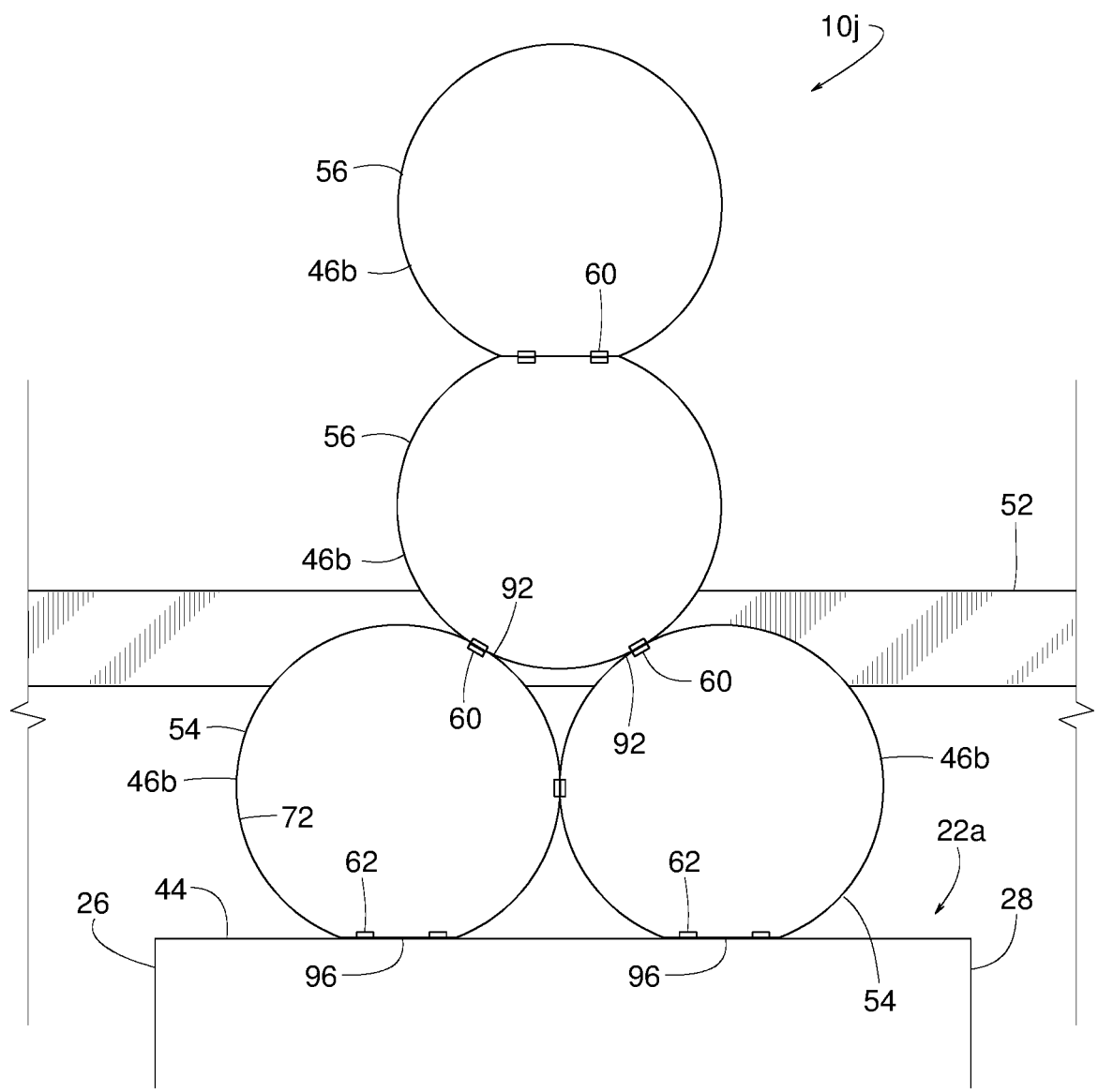
FIG. 17 is a cross-sectional view similar to FIG. 3 but showing another example air barrier system constructed in accordance with teachings disclosed herein.
Figure 18:
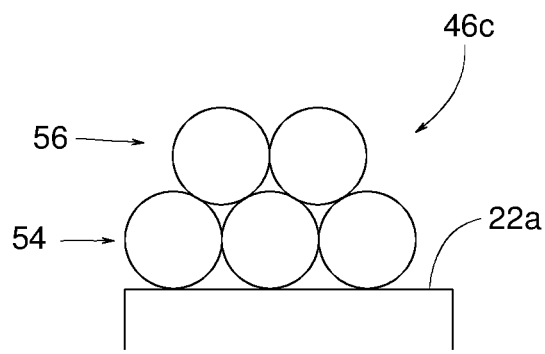
FIG. 18 is a schematic diagram related to FIGS. 16 and 17 but showing an alternate example air barrier arrangement in accordance with teachings disclosed herein.
Figure 19:
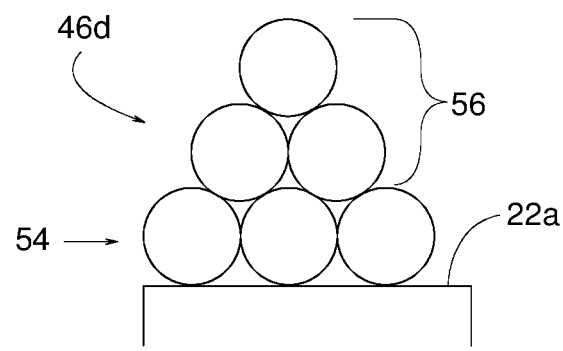
FIG. 19 is a schematic diagram similar to FIG. 18 but showing another example air barrier arrangement in accordance with teachings disclosed herein.
Figure 20:
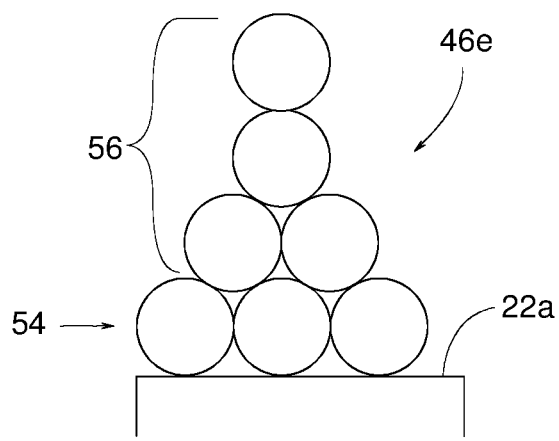
FIG. 20 is a schematic diagram similar to FIGS. 18 and 19 but showing another example air barrier arrangement in accordance with teachings disclosed herein.

Although FIGS. 3 and 4 show just two inflatable airducts 54, 56 stacked in a simple arrangement, FIGS. 16-20 show other example arrangements that can provide greater structural stability and/or improved air separation/insulation between hot and cold aisles. FIG. 16 shows a single upper inflatable airduct 56 set upon a plurality of lower inflatable airducts 54 (at least two lower inflatable airducts 54). FIG. 17 shows a plurality of upper inflatable airducts 56 (at least two upper inflatable airducts 56) stacked upon a plurality of lower inflatable airducts 54. FIG. 18 shows two upper inflatable airducts 56 on three lower inflatable airducts 54. FIG. 19 shows three upper inflatable airducts 56 on three lower inflatable airducts 54. FIG. 20 shows four upper inflatable airducts 56 on three lower inflatable airducts 54. In other examples, the diameter or width of one or more airducts in the arrangement may differ from the diameter or width of other ones of the airducts in the arrangement. In some examples, regardless of the number and/or arrangement of the airducts 54, 56, a collective width of the arrangement is less than or equal to the horizontal depth 84 (FIG. 3) of the computer cabinets 22

Figure 21:
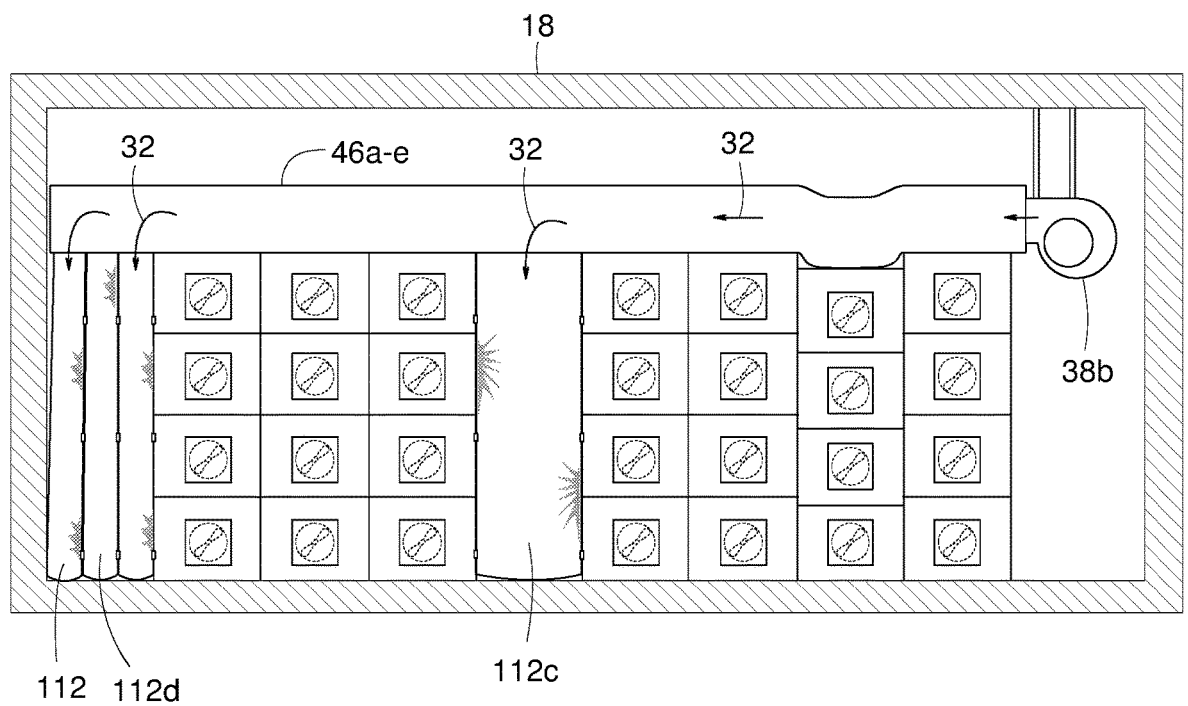
FIG. 21 is a side view similar to FIG. 9 but showing an example air barrier system constructed in accordance with teachings disclosed herein, wherein the air barrier system's manifold airduct is schematically illustrated to represent various example manifold airducts constructed in accordance with teachings disclosed herein.
Figure 22:
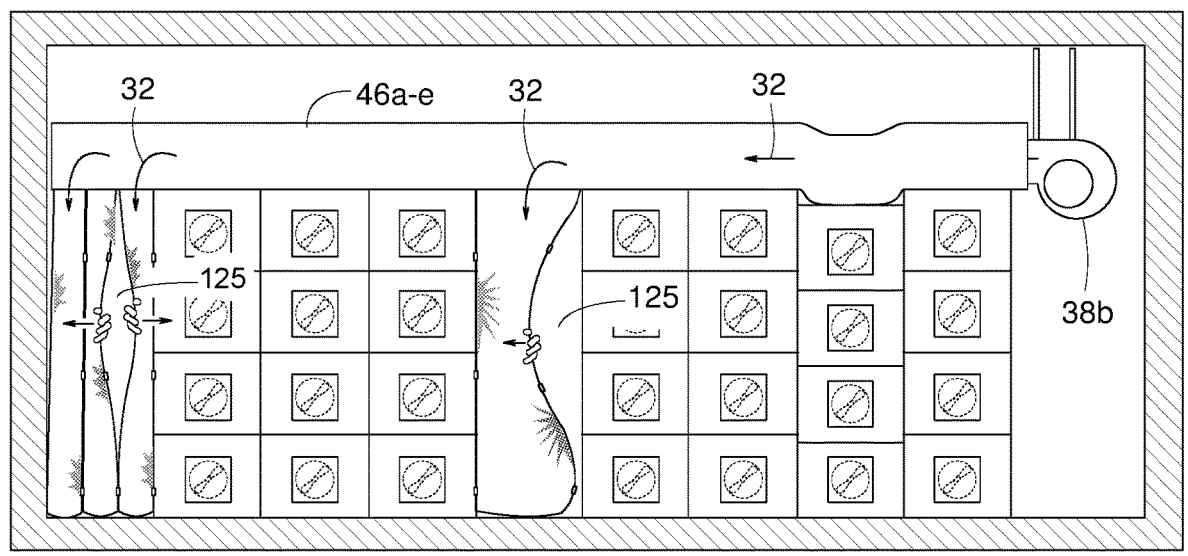
FIG. 22 is a side view similar to FIG. 21 but showing some barriers deflected to create walk-through openings.

In FIGS. 21 and 22, an inflatable airflow barrier 46a-e is schematically illustrated to show that various examples of inflatable airduct extensions 112 can be inflated via any of the inflatable airflow barriers disclosed herein, some of which include the airflow barrier 46a (FIG. 16), the airflow barrier 46b (FIG. 17), the airflow barrier 46c (FIG. 18), the airflow barrier 46d (FIG. 19), and the airflow barrier 46e (FIG. 20). More generally, any of the features shown and described in connection with any of the figures may be combined with any of the features as shown and described in any of the other figures. FIG. 21 shows vertically elongate inflatable airduct extensions 112 in their normal operating configuration, and FIG. 22 shows some of the airduct extensions 112 manually deflected to create the openings 125.

Figure 23:
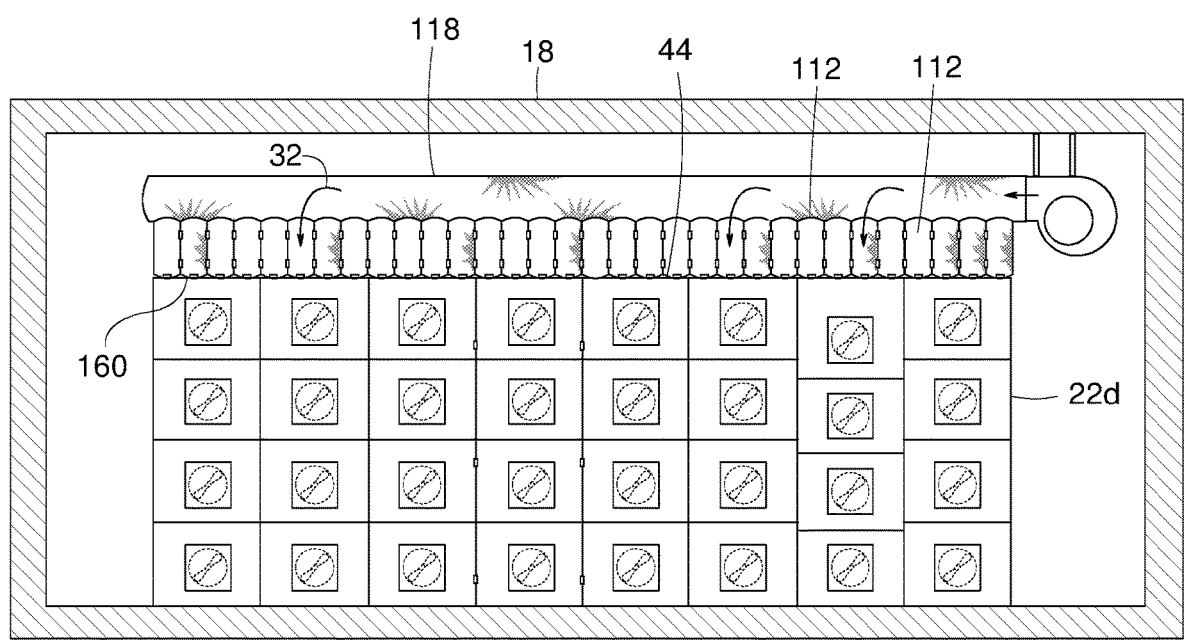
FIG. 23 is a side view similar to FIG. 9 but showing another example air barrier system constructed in accordance with teachings disclosed herein.

FIG. 23 shows the inflatable manifold airduct 118 delivering air 32 to inflate a series of airduct extensions 112. The airduct extensions 112 include a sealing surface 160 that seals against the top surface 44 of the computer cabinets 22d.

An example air barrier system 10k, shown in FIGS. 24 and 25, is similar to the air barrier system 10h of FIG. 14. In case of a fire, however, an example structure 128' of air barrier system 10k is configured to release at least a portion of the roof barrier 136 and/or the side barrier 130 so as not to interfere with the operation of a fire suppression system 162 of the building 18. In some examples, the configuration includes one or more fusible links 164 that connect the roof barrier 136 and/or the side barrier 130 to the frame 132. The term, "fusible link" refers to any structure that physically changes state in response to a characteristic associated with a fire or an impending fire. Some examples of characteristics associated with a fire include a predetermined elevated temperature, smoke, ionized air particles, a fire alarm tripping, activation of the fire suppression system 162, etc.

The fire suppression system 162 is schematically illustrated to represent any automatic means for assisting in extinguishing a fire. In some examples, the fire suppression system 162 comprises one or more nozzles for discharging a fire suppression fluid 170 (e.g., argon, carbon dioxide, nitrogen and combinations thereof, etc.).

In some examples, the fusible link 164 is a ring, loop, hook or other suitable connector having a relatively low temperature of phase change or decomposition (e.g., low melting temperature or low temperature of combustion). In some examples, the fusible link 164 melts when subjected to a predetermined abnormally high temperature. In some examples, the fusible link 164 has a lower melting temperature than the material of the roof barrier 136 and the side barrier 130. This allows the air barrier system 10k to respond appropriately to a fire without destroying the entire structure 128'.

Upon melting, the fusible link 164 changes from a holding state (FIG. 24) to a release state (FIG. 25). In the holding state, some examples of the fusible link 164 hold a lower portion 166 of the roof barrier 136 to the frame 132. In addition or alternatively, some examples of the fusible link 164 in the holding state hold an upper portion 168 of the side barrier 130 to the frame 132. Upon changing to the release state, the fusible link 164 allows lower portion 166 of the roof barrier 136 to swing down, which allows fire suppression material/fluid 170 to pass through the frame 132. In addition or alternatively, some examples of the fusible link 164 in the release state allow the upper portion 168 of the side barrier 134 to fall down to further promote the flow of fire suppression material/fluid 170.

Figure 26:
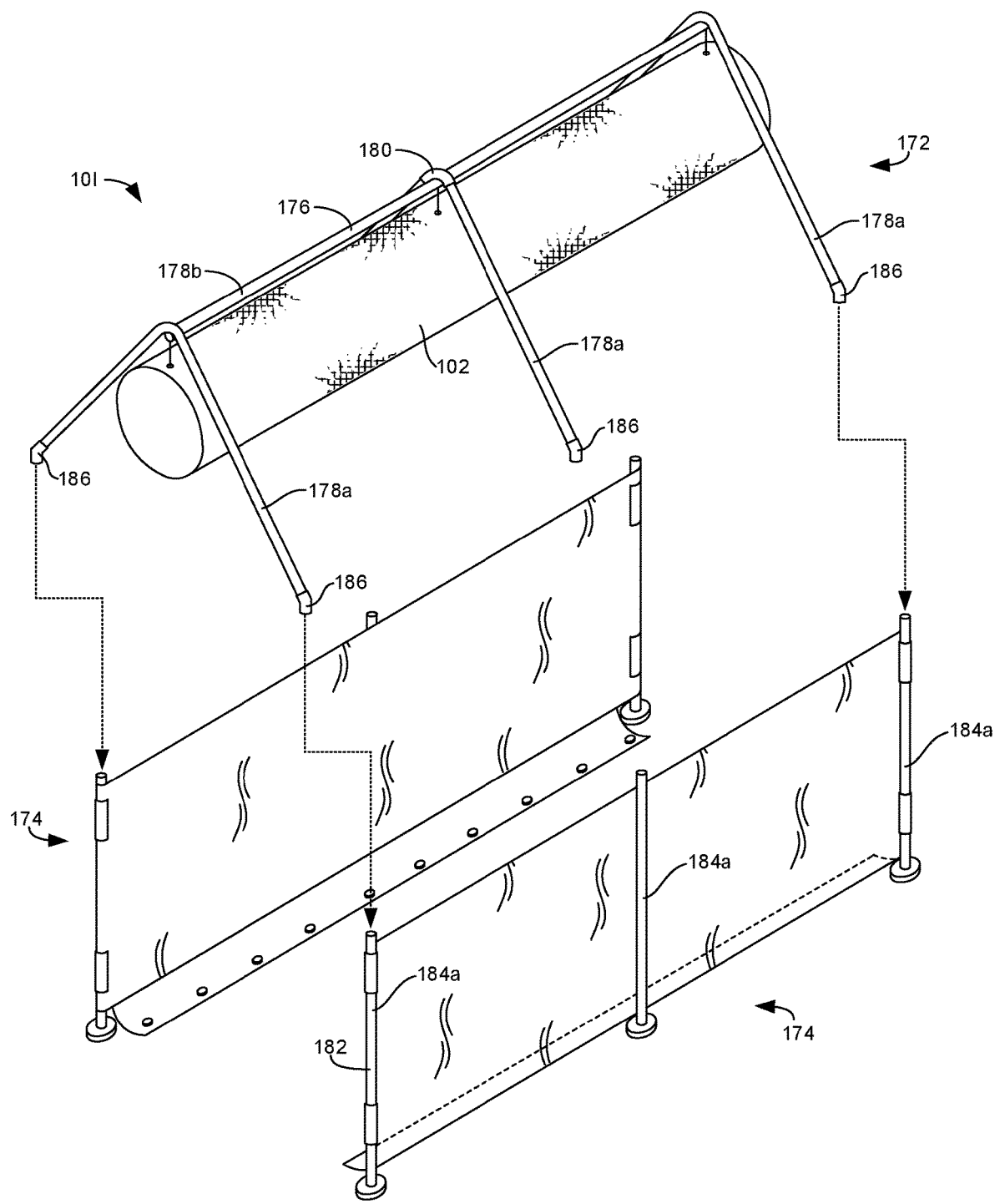
FIG. 26 is an exploded perspective view of another example air barrier system similar to that shown in FIG. 13.

Although FIGS. 13-15, 24, and 25 show the structures 128, 128' having a particular shape, other shapes are possible. More particularly, in some examples, the tubes 138 used to form the frame 132 of the structures 128, 128' may be assembled in different manners to produce barrier systems having different shapes to enable different locations and/or sizes of the wall barriers 130 and/or the roof barriers 136. For instance, an example air barrier system 10l is shown in FIG. 26 that includes a separate aisle spanning system 172 and two separate vertical support systems 174. In some example, the aisle spanning system includes a frame 176 formed from a plurality of interconnected tubes 178 including multiple transverse support tubes 178a and at least one longitudinal support tube 178b. The transverse support tubes 178a extend at least partially in a direction that is transverse to the associated airduct 102 supported by the frame 176 to span across an aisle 12, 14 between two rows of computer cabinets 22. By contrast, the longitudinal support tubes 178b extend at least partially in a direction along the length of the airduct 102 to interconnect different ones of the transverse support tubes 178a.

In some examples, a single or unitary transverse support tube 178a extends the full distance of the transverse width of the frame 176. Such transverse support tubes 178 may include a bend or curve along their length to provide for the A-frame or triangular-like structure as shown by the tubes 178a at the ends of the airduct 102 in FIG. 26. In other examples, the transverse support tubes may be bent or curved in different manners to provide different shapes for the frame 176 other than a triangular-like A-frame (e.g., a round or arched frame, a boxed or rectangular frame, a substantially flat frame etc.). In some examples, the particular shape of the frame 176 is achieved by interconnecting multiple different transverse support tubes 178a along the distance spanning the transverse width of the frame 176. For example, the center transverse support tube 178a in the illustrated example includes two separate tube segments interconnected by an elbow 180. In a similar manner, the longitudinal support tube 178b may be a single, unitary tube or a combination of multiple separate tubes interconnected in any suitable manner.

As shown in the illustrated example, the vertical support systems 174 includes a frame 182 formed from a plurality of interconnected side support tubes 184 including multiple spaced apart vertical support tubes 184a. In some examples, as shown in FIG. 26, the vertical support tubes 184a are spaced to connect with the transverse support tubes 178a of the frame 176 of the aisle spanning system 172 via elbows 186 and/or other suitable connecting means to form the full air barrier system 10l.

Figure 27:
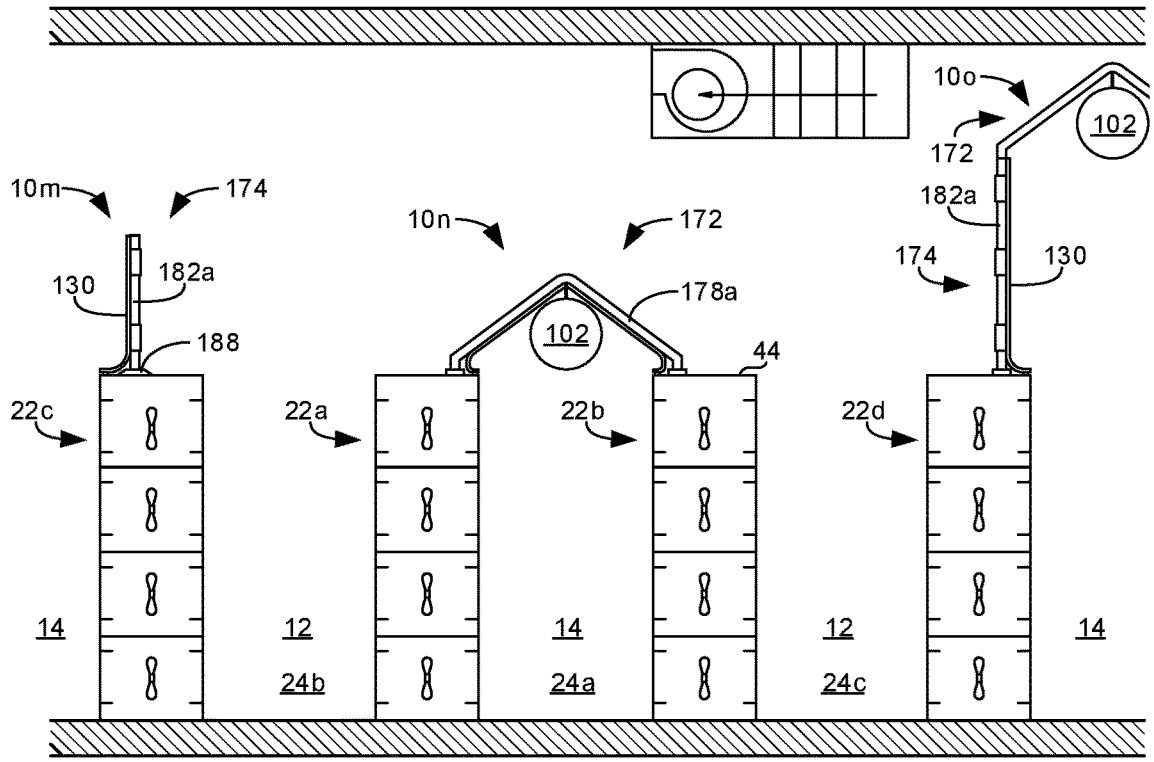
FIG. 27 is a cross-sectional view similar to FIG. 25 but showing the several different example air barrier systems constructed based on components of the example barrier system of FIG. 26.
Figure 28:
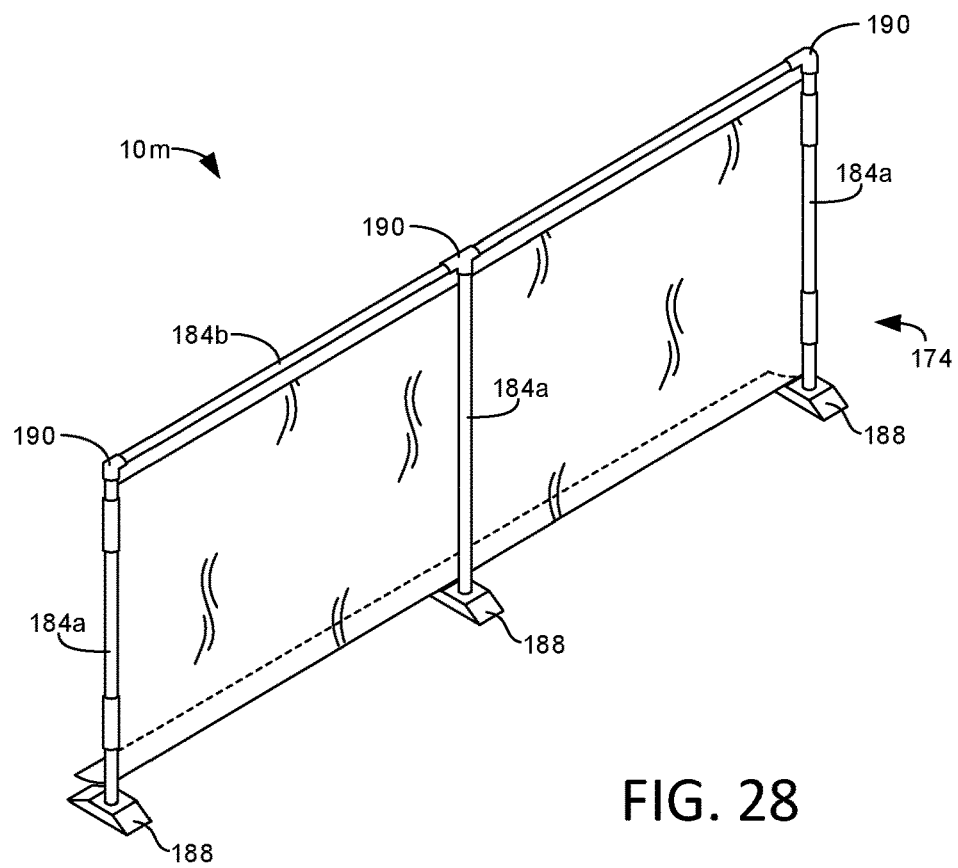
FIG. 28 is a perspective view of one of the example air barrier systems shown in FIG. 27.
Figure 29:
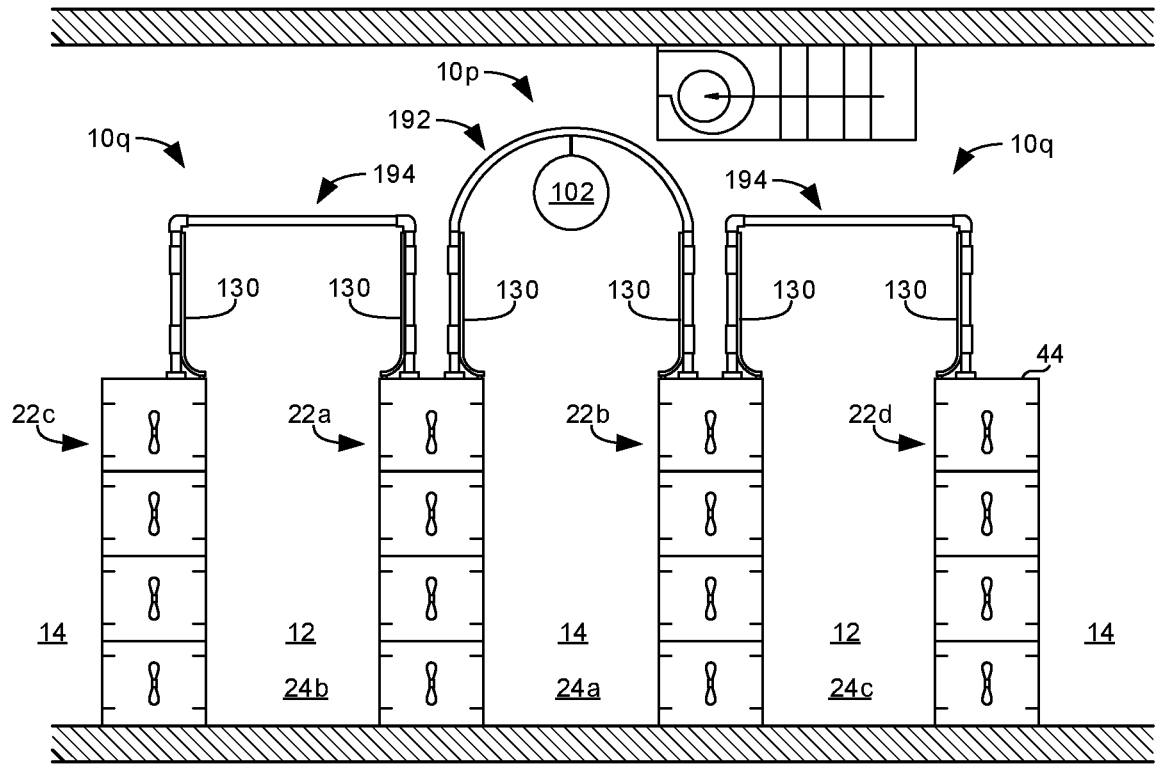
FIG. 29 is a cross-sectional view similar to FIG. 27 but showing additional example air barrier systems constructed in accordance with teachings disclosed herein.

In some examples, the aisle spanning system 172 and/or either one of the vertical support systems 174 may be used independently as separate air barrier systems as illustrated in FIG. 27. In particular, where the airduct 102 is supported independent of the air barrier system (e.g., as in FIGS. 7 and 11) or there is no airduct to otherwise be supported in connection with a particular aisle 12, 14 defined by the rows of computer cabinets 22, the vertical support system 174 may constitute an example air barrier system 10m that is not structurally coupled to any support structures extending over an aisle to an adjacent row of computer cabinets 22. In some such examples, the air barrier system 10m includes relatively wide feet 188 attached to the base of the vertical support tubes 184a to provide increased support/stability for the barrier system 10m in the transverse direction (e.g., transverse to the longitudinal length of the aisles 12, 14). Further, in some examples, to provide longitudinal support to the example barrier system 10m, separate ones of the vertical support tubes 184a are interconnected via one or more longitudinal support tube 184b as shown in the illustrated example of FIG. 28. More particularly, as shown in FIG. 28, the vertical support tubes 184a are interconnected via the longitudinal support tube 184b via suitable connectors 190.

Just as the vertical support system 174 may function as an independent air barrier system 10m, where there is sufficient vertical clearance (e.g., based on the height of the cabinets 22) to omit the vertical support systems 174, the aisle spanning system 172 may constitute an example air barrier system 10n illustrated in FIG. 27. In some examples, the feet 156 at the base of the vertical support tubes 184a in the example air barrier system 10m may be removed and attached to the base of the transverse support tubes 178a of the aisle spanning system 172 to facilitate the mounting of the air barrier system 10n to the top surface 44 of the cabinets 22.

In some examples, one or more of the transverse tubes 178a, the longitudinal support tubes 178b, the vertical support tubes 184a, and the longitudinal support tubes 184b may be interchangeable with one another. That is, in some examples, the different tubes 178, 184 may have similar diameters and similar lengths. In other examples, different ones of the tubes 178, 184 may have similar diameters but different lengths to enable shorter or longer tubes to be used in forming different aisle spanning systems 172 and/or side supporting systems 174 as needed. For instance, where increased clearance is desired underneath the aisle spanning system 172, vertical support systems 174 with longer vertical support tubes 184a may be used, as shown in the example air barrier system 10o in FIG. 27. In some examples, the longer vertical support tubes 184a may correspond to two or more shorter tubes longitudinally interconnected. Although the side barrier 130 is shown extending along substantially the full height of the vertical support tubes 184a in the illustrated example air barrier systems 10m, 10o, in other examples, the side barrier 130 may be shorter than the vertical support tubes 184a.

In addition to adjusting the size of the vertical support systems 174, the aisle spanning systems 172 may vary in size and/or shape. For instance, as shown in the illustrated example of FIG. 29, an example air barrier system 10p with a round or arched shaped aisle spanning system 192 is shown extending over the middle passageway 24a. By contrast, two separate air barrier systems 10q with flat aisle spanning systems 194 are shown extending over the outer passageways 24b, 24c. As shown in the illustrated example of FIG. 29, the widths of the air barrier systems 10p, 10q is less than the spacing of the rows of computer cabinets 22 such that facing sides of adjacent ones of the barrier systems may be supported on a single row of computer cabinets 22. That is, in some examples, the distance between adjacent air barrier systems is less than the width of the cabinets 22. Although the example barrier systems 10p, 10q are each shown in FIG. 27 with corresponding side barriers 130, in some examples, at least one of the side barriers 130 on the facing sides of the adjacent barrier systems 10p, 10q may be omitted.

Figure 30:
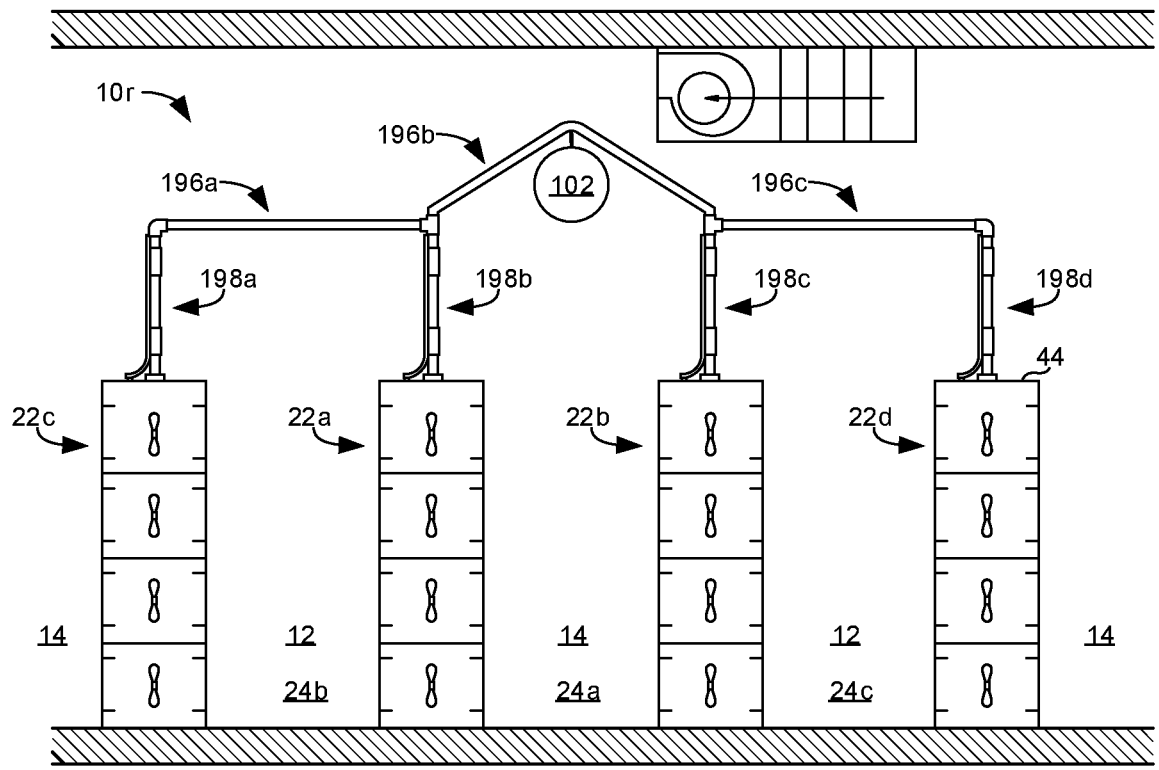
FIG. 30 is a cross-sectional view similar to FIG. 29 but showing another example air barrier systems constructed in accordance with teachings disclosed herein.

In some examples, the frame for air barrier systems between more than two rows of computer cabinets 22 may be combined into a single assembly. For instance, FIG. 30 shows an example air barrier system 10r that includes three different aisle spanning systems 196a-c and four different vertical support systems 198a-d. As shown in the illustrated example, the vertical support system are positioned approximately at the center of each corresponding row of cabinets 22. That is, in this example, the vertical support systems 198a-d are spaced approximately the same as the spacing of the rows of computer cabinets 22. In this manner, a single vertical support system 198 is able to support two separate aisle spanning systems 196 extending across opposing passageways 24 on either side of the cabinet supporting the corresponding vertical support system 198. Although the air barrier systems 101-r of FIGS. 26-30 are described as being assembled from a plurality of different tubes, in some examples, any number of the different tubes may be integrally formed. Any of the example barrier systems of FIGS. 13-15 and 24-30 can include suitable fasteners 140 and/or fusible links (e.g., clips, clamps, bands, magnets, hook-and-loop fasteners, zippers, snaps, zip ties, etc.) for securing the side barrier 130 and/or the roof barrier 136 to the frame 132, 176. In some examples, the fasteners 140 are releasable connectors structured to be easily removed, thereby enabling a user to assemble and disassemble the structure 128 with relatively limited effort. Though not illustrated in FIGS. 24-30, the example barrier systems 101-r can include a lip 142 made of the same lightweight fabric material as that of side barrier 130 and may be a unitary extension therefrom or a separate piece of pliable material attached to side barrier 130 using any suitable means (e.g., adhesive, sewing, hook and loop fasteners, a zipper, etc.). Further, any of the features described in connection with any of the example barrier systems in FIGS. 13-15 and 24-30 may be combined in any suitable manner with the features of other ones of such examples.

From the foregoing, it will be appreciated that example methods, apparatus and/or articles of manufacture have been disclosed that provide one or more benefits including being able to install dividing barriers for separating hot and cold aisles without having to fasten the barriers to structural members of a building, being able to provide dividing barriers that accommodate computer cabinets of uneven height, being able to provide dividing barriers that seal around obstructions that are little above a row of computer cabinets, and being able to provide dividing barriers that can be readily opened for allowing people and/or equipment to pass through.

Example air barrier systems for data centers having rows of computer cabinets are disclosed herein. Further examples and combinations thereof include the following:

Example 1 includes an air barrier system for a data center within a building, the air barrier system comprising a pliable barrier material to partition an area above a top of row of computer cabinets in the data center and below an overhead surface of the building, the pliable barrier material to reduce mixing of air between first and second aisles on opposites sides of the row of computer cabinets, and a frame to support the pliable barrier material in position when in the area above the top of the row of computer cabinets, the frame to be supported by the row of computer cabinets without support from the overhead surface.

Example 2 includes the air barrier system of example 1, further include a lip coupled to the pliable barrier material, the lip to sealingly engage a surface of the row of computer cabinets.

Example 3 includes the air barrier system of example 2, wherein the lip is unitarily formed with the pliable barrier material.

Example 4 includes the air barrier system of example 2, wherein the surface is a top surface of the row of computer cabinets.

Example 5 includes the air barrier system of example 2, wherein the surface is a side surface of the row of computer cabinets.

Example 6 includes the air barrier system of example 2, further including a releasable connection between the lip and the surface to facilitate the sealing engagement of the lip and the surface.

Example 7 includes the air barrier system of example 6, wherein the releasable connection is manually releasable by a person without the use of tools.

Example 8 includes the air barrier system of example 6, wherein the releasable connection includes at least one of a magnet, a hook-and-loop fastener, a zipper, a snap, or a zip tie.

Example 9 includes the air barrier system of example 1, wherein the frame rests upon a top surface of the row of computer cabinets.

Example 10 includes the air barrier system of example 1, further including releasable connections to secure the frame to the row of computer cabinets.

Example 11 includes the air barrier system of example 10, wherein the releasable connections are manually releasable by a person without the use of tools.

Example 12 includes the air barrier system of example 10, wherein the releasable connections include at least one of a magnet, a hook-and-loop fastener, or a snap.

Example 13 includes the air barrier system of example 1, wherein the frame includes a vertical support system, the vertical support system including a first tube spaced apart from a second tube, the first and second tubes to extend upward from the row of computer cabinets, the pliable barrier material to extend between the first and second tubes.

Example 14 includes the air barrier system of example 13, wherein the row of computer cabinets is a first row of computer cabinets and the vertical support system is a first vertical support system, the frame further including a second vertical support system to be supported by a second row of computer cabinets, the first and second row of computer cabinets defining opposite sides of the first aisle, and an aisle spanning system to extend across the first aisle, the first vertical support system to be coupled to the second vertical support system via the aisle spanning system.

Example 15 includes the air barrier system of example 14, further including a pliable roof barrier material to be carried by the aisle spanning material.

Example 16 includes the air barrier system of example 15, wherein the pliable roof barrier is unitarily formed with the pliable barrier material.

Example 17 includes the air barrier system of example 14, wherein the aisle spanning system is a first aisle spanning system, the frame including a second aisle spanning system to extend across the second aisle, the first vertical support system to support both the first and second aisle spanning systems.

Example 18 includes the air barrier system of example 1, wherein the row of computer cabinets is a first row of computer cabinets, the frame including an aisle spanning system to extend over the first aisle towards a second row of computer cabinets, the first and second row of computer cabinets defining opposite sides of the first aisle.

Example 19 includes the air barrier system of example 18, further including an airduct supported by the aisle spanning system, the airduct to extend along a length of the first aisle.

Example 20 includes the air barrier system of example 18, wherein the aisle spanning system includes at least one of a generally triangular shape, a generally flat shape, or a generally arched shape.

Example 21 includes the air barrier system of example 1, further including a fusible link to hold the pliable barrier material adjacent the frame, the fusible link to release the pliable barrier material in response to a characteristic associated with a fire or an impending fire.

Example 22 includes an air barrier system for a data center within a room, the air barrier system comprising a frame to extend upward from a row of computer cabinets within the room, the frame to be spaced apart and detached from an overhead surface of the room, the frame to extend along a length of the row of computer cabinets, the frame to rest upon the row of computer cabinets, and a barrier made of a pliable material to be carried by the frame, the barrier to obstruct air from passing over the row of computer cabinets between passageways on either side of the row of computer cabinets.

Example 23 includes an apparatus, comprising a first tube, a second tube spaced apart from the first tube, first and second releasable connectors coupled to the first and second tubes respectively, the first and second releasable connectors to releasably connect the first and second tubes to a row of computer cabinets to secure the first and second tubes in a position above the row of computer cabinets, and a pliable material to extend between the first and second tubes, the pliable material to obstruct air from passing between the first and second tubes to reduce mixing of air on either side of the row of computer cabinets.

Example 24 includes an air barrier system for a data center, wherein the data center includes a first row of computer cabinets within a building, the first row of computer cabinets being interposed between a cold aisle and a hot aisle, the first row of computer cabinets defining an air passageway between the cold aisle and the hot aisle, the first row of computer cabinets having a top surface that is below and spaced apart from an overhead surface of the building to define a gap between the top surface and the overhead surface, the air barrier system comprising a lower inflatable airduct to be disposed within the gap so as to sealingly engage the top surface of the first plurality of computer cabinets, the lower inflatable airduct being elongate in a lengthwise direction, the lower inflatable airduct having selectively an inflated state and a deflated state, the lower inflatable airduct filling more of the gap when the lower inflatable airduct is in the inflated state than when the lower inflatable airduct is in the deflated state, and an upper inflatable airduct being elongate in the lengthwise direction, the upper inflatable airduct being on top of the lower inflatable airduct and lying substantially parallel to the lower inflatable airduct, the lower inflatable airduct in combination with the upper inflatable airduct providing an inflatable barrier having a barrier height extending vertically from a lowermost point of the lower inflatable airduct to an uppermost point of the upper inflatable airduct, the inflatable barrier having a barrier width extending in a horizontal direction substantially perpendicular to both the barrier height and the lengthwise direction, the barrier height being greater than the barrier width.

Example 25 includes the air barrier system of example 24, wherein the lower inflatable airduct when inflated against the top surface of the plurality of computer cabinets provides a cabinet-sealing surface of varying elevation to accommodate the top surface of the plurality of computer cabinets in examples where the top surface varies in height.

Example 26 includes the air barrier system of example 24, further comprising a releasable connection between the upper inflatable airduct the lower inflatable airduct.

Example 27 includes the air barrier system of example 24, further comprising a releasable connection between the upper inflatable airduct the lower inflatable airduct, wherein the releasable connection includes at least one of a magnet, a hook-and-loop fastener, a zipper, a snap, and a ratchet tie.

Example 28 includes the air barrier system of example 24, further comprising a block-off member extending vertically between the lower inflatable airduct and the upper inflatable airduct.

Example 29 includes the air barrier system of example 24, further comprising a block-off member extending downward from the lower inflatable airduct.

Example 30 includes the air barrier system of example 24, wherein the upper inflatable airduct and the lower inflatable airduct define an obstruction-accommodating opening therebetween.

Example 31 includes the air barrier system of example 24, further comprising a substantially horizontal panel connecting the upper inflatable airduct to the lower inflatable airduct.

Example 32 includes the air barrier system of example 24, further comprising a substantially prop connected to an exterior of both the upper inflatable airduct and the lower inflatable airduct, the substantially prop being stiffer than the upper inflatable airduct and the lower inflatable airduct.

Example 33 includes the air barrier system of example 32, wherein the substantially prop is a post to be set upon the top surface of the first row of computer cabinets.

Example 34 includes the air barrier system of example 32, further comprising a loop on the inflatable barrier, the loop connecting the substantially prop to the inflatable barrier.

Example 35 includes the air barrier system of example 24, further comprising a relatively cool current of air passing through one of the upper inflatable air duct and the lower inflatable airduct, and the relatively cool current of air to be discharged from within the inflatable barrier into the cold aisle.

Example 36 includes the air barrier system of example 35, wherein the upper inflatable airduct engages the overhead surface of the building when the air barrier system is installed between the top surface of the first row of computer cabinets and the overhead surface of the building.

Example 37 includes the air barrier system of example 35, wherein the upper inflatable airduct is spaced apart from the overhead surface of the building when the air barrier system is installed between the top surface of the first row of computer cabinets and the overhead surface of the building.

Example 38 includes the air barrier system of example 24, wherein the lower inflatable airduct is one of a plurality of lower inflatable airducts arranged in side-by-side relationship with each other, each lower inflatable airduct of the plurality of inflatable airducts being connected to the upper inflatable airduct.

Example 39 includes the air barrier system of example 24, wherein the upper inflatable airduct is one of a plurality of upper inflatable airducts that are stacked on top of the lower inflatable airduct.

Example 40 includes the air barrier system of example 24, wherein the building includes a building wall and the first row of computer cabinets includes at least one of a first substantially vertical sidewall and a second substantially vertical sidewall extending between the cold aisle and the hot aisle, and the air barrier system further comprising a first inflatable airduct being vertically elongate, the first inflatable airduct having a first sealing surface that is substantially vertical to be in sealing engagement with the first substantially vertical sidewall of the first row of cabinets.

Example 41 includes the air barrier system of example 40, further comprising a second inflatable airduct being vertically elongate, the second inflatable airduct having a second sealing surface that is substantially vertical to be in sealing engagement with one of the building wall and the second substantially vertical sidewall of the first row of cabinets, the first sealing surface and the second sealing surface facing away from each other.

Example 42 includes the air barrier system of example 40, wherein the first inflatable airduct includes a second sealing surface that is substantially vertical and facing away from the first sealing surface, the second sealing surface to be in sealing engagement with one of the building wall and the second substantially vertical sidewall of the first row of cabinets.

Example 43 includes the air barrier system of example 41, further comprising a releasable connection between the first inflatable airduct and the second inflatable airduct.

Example 44 includes the air barrier system of example 41, further comprising a releasable connection between the first inflatable airduct and the second inflatable airduct, wherein the releasable connection includes at least one of a magnet, a hook-and-loop fastener, a zipper, a snap, and a ratchet tie.

Example 45 includes the air barrier system of example 41, wherein the first inflatable airduct and the second inflatable airduct have selectively an open configuration and a closed configuration, the first inflatable airduct and the second inflatable airduct in the open configuration defining a walk-through opening therebetween, the first inflatable airduct and the second inflatable airduct in the closed configuration sealing off the walk-through opening.

Example 46 includes an air barrier system for a data center, wherein the data center includes a first row of computer cabinets within a building that includes a building wall, the first row of computer cabinets being interposed between a cold aisle and a hot aisle, the first row of computer cabinets defining an air passageway between the cold aisle and the hot aisle, the first row of computer cabinets having a top surface that is below and spaced apart from an overhead surface of the building to define a gap between the top surface and the overhead surface, the first row of computer cabinets having a first substantially vertical sidewall extending between the cold aisle and the hot aisle, the first row of computer cabinets having a second substantially vertical sidewall extending between the cold aisle and the hot aisle, the first substantially vertical sidewall being spaced apart from the second substantially vertical sidewall, the air barrier system comprising a first inflatable airduct being vertically elongate, the first inflatable airduct having a first sealing surface that is substantially vertical to be in sealing engagement with the first substantially vertical sidewall of the first row of cabinets.

Example 47 includes the air barrier system of example 46, further comprising a second inflatable airduct being vertically elongate, the second inflatable airduct having a second sealing surface that is substantially vertical to be in sealing engagement with one of the building wall and the second substantially vertical sidewall of the first row of cabinets, the first sealing surface and the second sealing surface facing away from each other.

Example 48 includes the air barrier system of example 46, wherein the first inflatable airduct includes a second sealing surface that is substantially vertical and facing away from the first sealing surface, the second sealing surface to be in sealing engagement with one of the building wall and the second substantially vertical sidewall of the first row of cabinets.

Example 49 includes the air barrier system of example 47, wherein the first inflatable airduct and the second inflatable airduct are disposed to be in sealing engagement with the top surface of the first row of computer cabinets.

Example 50 includes the air barrier system of example 47, further comprising a releasable connection between the first inflatable airduct and the second inflatable airduct.

Example 51 includes the air barrier system of example 47, further comprising a releasable connection between the first inflatable airduct and the second inflatable airduct, wherein the releasable connection includes at least one of a magnet, a hook-and-loop fastener, a zipper, a snap, and a ratchet tie.

Example 52 includes the air barrier system of example 47, further comprising an inflatable manifold airduct connected in fluid communication with the first inflatable airduct and the second inflatable airduct, the inflatable manifold airduct being horizontally elongate.

Example 53 includes the air barrier system of example 47, further comprising an inflatable manifold airduct connected in fluid communication with the first inflatable airduct and the second inflatable airduct, the inflatable manifold airduct being horizontally elongate, the first inflatable airduct and the second inflatable airduct being suspended from the inflatable manifold airduct.

Example 54 includes the air barrier system of example 47, wherein the first inflatable airduct and the second inflatable airduct have selectively an open configuration and a closed configuration, the first inflatable airduct and the second inflatable airduct in the open configuration defining a walk-through opening therebetween, the first inflatable airduct and the second inflatable airduct in the closed configuration sealing off the walk-through opening.

Example 55 includes the air barrier system of example 46, further comprising a blower forcing a current of air through the first inflatable airduct, the current of air to be discharged from within the first inflatable airduct into the cold aisle.

Example 56 includes the air barrier system of example 46, further comprising a main blower to be forcing a main current of air into the cold aisle, then through the air passageway of the first row of computer cabinets, and then into the hot aisle, and a secondary blower inflating the first inflatable airduct.

Example 57 includes an air barrier system for a data center, wherein the data center includes a first row of computer cabinets and a second row of computer cabinets within a building, the first row of computer cabinets being spaced apart from the second row of computer cabinets to define a middle passageway therebetween, the first row of computer cabinets being interposed between the middle passageway and a first outer passageway, the second row of computer cabinets being interposed between the middle passageway and a second outer passageway, the first row of computer cabinets defining a first air passageway between the middle passageway and the first outer passageway, the second row of computer cabinets defining a second air passageway between the middle passageway and the second outer passageway, the first row of computer cabinets having a first top surface that is below and spaced apart from an overhead surface of the building, the second row of computer cabinets having a second top surface that is below and spaced apart from the overhead surface of the building, the air barrier system comprising a frame to extend over the middle passageway and to rest upon both the first top surface of the first row of computer cabinets and the second top surface of the second row of computer cabinets, a first side barrier attached to the frame so as to extend upward from the first top surface of the first row of computer cabinets, and a second side barrier attached to the frame so as to extend upward from the second top surface of the second row of computer cabinets.

Example 58 includes the air barrier system of example 57, wherein the frame, the first side barrier and the second side barrier provides a shelter to be spaced apart from the overhead surface of the building.

Example 59 includes the air barrier system of example 57, wherein the frame is stiffer than both the first side barrier and the second side barrier.

Example 60 includes the air barrier system of example 57, wherein both the first side barrier and the second side barrier are made of a pliable sheet of material that is more flexible than the frame.

Example 61 includes the air barrier system of example 60, further comprising a releasable clip connecting the pliable sheet of material to the frame.

Example 62 includes the air barrier system of example 60, wherein the frame includes a first leg to rest upon the first top surface of the first row of computer cabinets, the frame includes a second leg to rest upon the second top surface of the second row of computers, and at least some of the pliable sheet of material lies substantially parallel to the first leg.

Example 63 includes the air barrier system of example 57, wherein the first side barrier is made of a pliable sheet of material that is more flexible than the frame, and the air barrier system further comprising a lower lip extending from the first side barrier to be sealingly engaged with the first top surface of the first row of computer cabinets, the lower lip being deflectable out of coplanar alignment with the first side barrier.

Example 64 includes the air barrier system of example 57, further comprising an airduct laterally interposed between the first side barrier and the second side barrier.

Example 65 includes the air barrier system of example 57, further comprising a blower forcing a current of air into the airduct, the current of air to be discharged from within the airduct into the middle passageway.

Example 66 includes the air barrier system of example 65, wherein the middle passageway is cooler than the first and second outer passageways.

Example 67 includes the air barrier system of example 57, further comprising an inflatable airduct laterally interposed between the first side barrier and the second side barrier.

Example 68 includes the air barrier system of example 67, wherein the inflatable airduct defines a plurality of apertures through which air can pass between the middle passageway and an interior of the inflatable airduct.

Example 69 includes the air barrier system of example 57, further comprising an airduct suspended underneath the frame to be disposed over the middle passageway.

Example 70 includes the air barrier system of example 57, further comprising a track attached to the frame, the track being horizontally elongate, and an airduct suspended from the track and being laterally interposed between the first side barrier and the second side barrier.

Example 71 includes the air barrier system of example 57, further comprising a roof barrier supported by the frame and extending between the first side barrier and the second side barrier, the roof barrier to be disposed above the middle passageway.

Example 72 includes the air barrier system of example 71, wherein the roof barrier is made of a pliable sheet of material that is more flexible than the frame. 73 the air barrier system of example 71, wherein the roof barrier has selectively a normal configuration and a collapsed configuration, the roof barrier spanning a greater horizontal distance in the normal configuration than in the collapsed configuration.

Example 74 includes the air barrier system of example 71, further comprising a fusible link having selectively a holding state and a release state, the fusible link connecting the roof barrier to the frame when the fusible link is in the holding state, the fusible link releasing at least a portion of the roof barrier from the frame when the fusible link is in the release state.

Example 75 includes the air barrier system of example 74, wherein the fusible link has a lower melting temperature than that of the roof barrier.

Example 76 includes the air barrier system of example 57, further comprising a magnet attached to at least one of the first side barrier, the second side barrier and the frame.

Example 77 includes the air barrier system of example 57, wherein the first side barrier has selectively a normal configuration and a collapsed configuration, the first side barrier providing an airflow obstruction that is greater in the normal configuration than in the collapsed configuration.

Example 78 includes the air barrier system of example 77, wherein the airflow obstruction is between the middle passageway and the first outer passageway.

Example 79 includes the air barrier system of example 57, wherein the first side barrier has selectively a normal configuration and a collapsed configuration, the first side barrier extending farther upward in the normal configuration than in the collapsed configuration.

Example 80 includes the air barrier system of example 57, further comprising a fusible link having selectively a holding state and a release state, the fusible link connecting the first side barrier to the frame when the fusible link is in the holding state, the fusible link releasing at least a portion of the first side barrier from the frame when the fusible link is in the release state.

Example 81 includes the air barrier system of example 80, wherein the fusible link has a lower melting temperature than that of the first side barrier.

Example 82 includes an air barrier system for a data center, wherein the data center includes a first row of computer cabinets and a second row of computer cabinets within a building, the first row of computer cabinets being spaced apart from the second row of computer cabinets to define a middle passageway therebetween, the first row of computer cabinets being interposed between the middle passageway and a first outer passageway, the second row of computer cabinets being interposed between the middle passageway and a second outer passageway, the first row of computer cabinets defining a first air passageway between the middle passageway and the first outer passageway, the second row of computer cabinets defining a second air passageway between the middle passageway and the second outer passageway, the first row of computer cabinets having a first top surface that is below and spaced apart from an overhead surface of the building, the second row of computer cabinets having a second top surface that is below and spaced apart from the overhead surface of the building, the air barrier system comprising a frame to extend over the middle passageway, to be spaced apart from the overhead surface of the building, and to rest upon both the first top surface of the first row of computer cabinets and the second top surface of the second row of computer cabinets, and an airduct suspended from the frame.

Example 83 includes the air barrier system of example 82, further comprising a blower forcing a current of air into the airduct, the current of air to be discharged from within the airduct into the middle passageway.

Example 84 includes the air barrier system of example 82, wherein the middle passageway is cooler than the first and second outer passageways.

Example 85 includes the air barrier system of example 82, wherein the airduct is inflatable.

Example 86 includes the air barrier system of example 82, wherein the airduct defines a plurality of apertures through which air can pass between the middle passageway and an interior of the airduct.

Example 87 includes the air barrier system of example 82, further comprising a track that couples the airduct to the frame, the track being horizontally elongate.

Example 88 includes an air barrier system for a data center, wherein the data center includes a first row of computer cabinets within a building that includes a building wall, the first row of computer cabinets being interposed between a cold aisle and a hot aisle, the first row of computer cabinets defining an air passageway between the cold aisle and the hot aisle, the first row of computer cabinets having a top surface that is below and spaced apart from an overhead surface of the building to define a gap between the top surface and the overhead surface, the air barrier system comprising a first inflatable airduct being vertically elongate, the first inflatable airduct having a lower sealing surface to be in sealing engagement with the top surface of the first row of cabinets.

Example 89 includes the air barrier system of example 88, further comprising a manifold airduct connected in fluid communication with the first inflatable airduct, the manifold airduct being horizontally elongate.

Example 90 includes the air barrier system of example 89, wherein the manifold airduct is inflatable.

Although certain example methods, apparatus, and articles of manufacture have been disclosed herein, the scope of coverage of this patent is not limited thereto. On the contrary, this patent covers all methods, apparatus, and articles of manufacture falling within the scope of the claims of this patent.

The invention claimed is:

1. An air barrier system within a building, the air barrier system comprising:
   a pliable barrier material to partition an area above a top of a first row of cabinets below an overhead surface of the building, the cabinets to support heat-generating components, the pliable barrier material to reduce mixing of air between first and second aisles on opposites sides of the first row of cabinets;
   a frame to support the pliable barrier material in position when in the area above the top of the first row of cabinets, the frame to be supported by the first row of cabinets without support from the overhead surface,
   the frame including a plurality of transverse support tubes to extend over the first aisle towards a second row of cabinets, the first and second row of cabinets defining opposite sides of the first aisle; and
   an airduct to be suspended from the frame, the airduct to extend along a length of the first aisle underneath the transverse support tubes.

2. The air barrier system of claim 1, further including a lip coupled to the pliable barrier material, the lip to sealingly engage a surface of the first row of cabinets.

3. The air barrier system of claim 2, wherein the lip is unitarily formed with the pliable barrier material.

4. The air barrier system of claim 2, wherein the surface is a top surface of the first row of cabinets.

5. The air barrier system of claim 2, further including a releasable connection between the lip and the surface to facilitate the sealing engagement of the lip and the surface.

6. The air barrier system of claim 5, wherein the releasable connection is manually releasable by a person without the use of tools.

7. The air barrier system of claim 5, wherein the releasable connection includes at least one of a magnet, a hook-and-loop fastener, a zipper, a snap, or a zip tie.

8. The air barrier system of claim 1, wherein the frame rests upon a top surface of the first row of cabinets.

9. The air barrier system of claim 1, further including releasable connections to secure the frame to the first row of cabinets.

10. The air barrier system of claim 9, wherein the releasable connections are manually releasable by a person without the use of tools.

11. The air barrier system of claim 9, wherein the releasable connections include at least one of a magnet, a hook-and-loop fastener, or a snap.

12. The air barrier system of claim 1, wherein the frame includes a vertical support system, the vertical support system including a first tube spaced apart from a second tube, the first and second tubes to extend upward from the first row of cabinets, the pliable barrier material to extend between the first and second tubes.

13. The air barrier system of claim 12, wherein the vertical support system is a first vertical support system, the frame further including:
a second vertical support system to be supported by the second row of cabinets, the first vertical support system to be coupled to the second vertical support system via the transverse support tubes.

14. The air barrier system of claim 13, further including a pliable roof barrier material to be carried by the transverse support tubes.

15. The air barrier system of claim 14, wherein the pliable roof barrier material is unitarily formed with the pliable barrier material.

16. The air barrier system of claim 1, wherein the transverse support tubes define at least one of a generally triangular shape, a generally flat shape, or a generally arched shape.

17. The air barrier system of claim 1, further including a fusible link to hold the pliable barrier material adjacent the frame, the fusible link to release the pliable barrier material in response to a characteristic associated with a fire or an impending fire.

18. An air barrier system within a building, the air barrier system comprising:
a pliable barrier material to partition an area above a top of a first row of cabinets below an overhead surface of the building, the cabinets to support heat-generating components, the pliable barrier material to reduce mixing of air between first and second aisles on opposites sides of the first row of cabinets;
a frame to support the pliable barrier material in position when in the area above the top of the first row of cabinets, the frame to be supported by the first row of cabinets without support from the overhead surface, the frame including:
a first vertical support system to be supported by the first row of cabinets; and
a second vertical support system to be supported by a second row of cabinets, the first and second row of cabinets defining opposite sides of the first aisle; and
a first aisle spanning system to extend across the first aisle, the first vertical support system to be coupled to the second vertical support system via the first aisle spanning system; and
a second aisle spanning system to extend across the second aisle, the first vertical support system to support both the first and second aisle spanning systems.

19. An air barrier system for a data center within a room, the air barrier system comprising:
a frame to extend upward from first and second rows of cabinets within the room, the cabinets to support components that generate heat, the frame to span across a first passageway between the first and second rows of cabinets, the frame to be spaced apart and detached from an overhead surface of the room, the frame to extend along a length of the first and second rows of cabinets, the frame to rest upon the first and second rows of cabinets;
a barrier made of a pliable material to be carried by the frame, the barrier to obstruct air from passing over the first row of cabinets between the first passageway and a second passageway on a side of the first row of cabinets opposite the first passageway; and
an airduct to hang from the frame so as to position the airduct above the first passageway, the frame to extend over top of the airduct.

20. An apparatus, comprising:
a first tube;
a second tube spaced apart from the first tube;
first and second releasable connectors coupled to the first and second tubes respectively, the first and second releasable connectors to releasably connect the first and second tubes to a first row of cabinets to secure the first and second tubes in a position above the first row of cabinets;
a pliable material to extend between the first and second tubes, the pliable material to obstruct air from passing between the first and second tubes to reduce mixing of air on either side of the first row of cabinets;
an aisle spanning system to extend between (i) the first and second tubes and (ii) additional tubes to be supported by a second row of cabinets, the aisle spanning system to span an aisle between the first and second rows of cabinets; and
an airduct to be below and suspended from the aisle spanning system.

21. The apparatus of claim 20, further including hangers to suspend the airduct from the aisle spanning system.

22. The apparatus of claim 20, wherein the airduct is to be suspended from a peak of the aisle spanning system.

* * * * *